(12) United States Patent
Inagaki

(10) Patent No.: US 8,151,868 B2
(45) Date of Patent: Apr. 10, 2012

(54) EASILY ASSEMBLED COOLER

(75) Inventor: Mitsuharu Inagaki, Kariya (JP)

(73) Assignee: Denso Corporation, Kariya (JP)

( * ) Notice: Subject to any disclaimer, the term of this patent is extended or adjusted under 35 U.S.C. 154(b) by 749 days.

(21) Appl. No.: 12/157,975

(22) Filed: Jun. 13, 2008

(65) Prior Publication Data

US 2009/0008061 A1    Jan. 8, 2009

Related U.S. Application Data

(62) Division of application No. 11/013,140, filed on Dec. 15, 2004, now abandoned.

(30) Foreign Application Priority Data

Dec. 18, 2003 (JP) .................... 2003-421340
Feb. 12, 2004 (JP) .................... 2004-35226
Jun. 15, 2004 (JP) .................... 2004-177351
Aug. 25, 2004 (JP) .................... 2004-245140

(51) Int. Cl.
F28F 7/00    (2006.01)
H05K 7/20    (2006.01)

(52) U.S. Cl. .................... 165/80.4; 165/153
(58) Field of Classification Search .............. 165/80.4, 165/153, 177, 178, 104.33, 170, 109.1; 361/699; 257/714

See application file for complete search history.

(56) References Cited

U.S. PATENT DOCUMENTS

| | | | | |
|---|---|---|---|---|
| 3,436,603 A * | 4/1969 | Vogt | ................ | 361/711 |
| 3,603,381 A * | 9/1971 | Scherbaum et al. | .......... | 165/80.4 |
| 3,650,321 A * | 3/1972 | Kaltz | ................ | 165/104.33 |
| 4,420,739 A * | 12/1983 | Herren | .................. | 338/53 |
| 4,559,580 A * | 12/1985 | Lutfy | .................. | 361/689 |
| 4,578,745 A * | 3/1986 | Olsson | .................. | 363/68 |
| 4,815,532 A * | 3/1989 | Sasaki et al. | .......... | 165/152 |
| 5,053,856 A | 10/1991 | Davidson | | |
| 5,099,912 A | 3/1992 | Tajima et al. | | |
| 6,070,428 A * | 6/2000 | Higashiyama et al. | ........ | 62/525 |
| 6,412,174 B1 | 7/2002 | Kawano et al. | | |
| 6,449,979 B1 | 9/2002 | Nagasawa et al. | | |
| 6,542,365 B2 | 4/2003 | Inoue | | |

(Continued)

FOREIGN PATENT DOCUMENTS

JP   63-128793   6/1988

(Continued)

OTHER PUBLICATIONS

Office Action issued on Oct. 31, 2008 in corresponding Japanese patent application No. 2004-245140 with English translation.

*Primary Examiner* — Tho V Duong
(74) *Attorney, Agent, or Firm* — Harness, Dickey & Pierce, PLC

(57) ABSTRACT

A cooler capable of reducing the fabrication cost is provided. In the cooler, in which electronic parts 6 are held between neighboring tubes 1, each of the tubes 1 is formed by joining the edges of plates 1a, 1b, each of which is formed into a predetermined shape by press molding, and fins 5 for accelerating heat exchange are arranged in the tube 1. As an inner wall conventionally exists when the tube 1 is manufactured by extrusion, can be removed, it is no longer necessary to remove the inner wall by machining, therefore, the fabrication cost can be reduced.

9 Claims, 22 Drawing Sheets

U.S. PATENT DOCUMENTS

| | | |
|---|---|---|
| 6,563,709 B2 | 5/2003 | Negishi et al. |
| 6,639,798 B1 | 10/2003 | Jeter et al. |
| 6,799,628 B1 | 10/2004 | Masseth et al. |
| 6,819,561 B2 | 11/2004 | Hartzell et al. |
| 7,191,824 B2 * | 3/2007 | Wu et al. .................. 165/141 |
| 2001/0010262 A1 | 8/2001 | Komoda |
| 2001/0033477 A1 | 10/2001 | Inoue et al. |
| 2002/0003161 A1 | 1/2002 | Kouno et al. |
| 2002/0007935 A1 | 1/2002 | Marsala |
| 2002/0038701 A1 * | 4/2002 | Saito et al. .................. 165/153 |
| 2002/0078566 A1 | 6/2002 | Torigoe et al. |
| 2003/0090873 A1 | 5/2003 | Ohkouchi |
| 2004/0144996 A1 | 7/2004 | Inoue |
| 2005/0051298 A1 * | 3/2005 | Sakai .......................... 165/80.4 |

FOREIGN PATENT DOCUMENTS

| | | |
|---|---|---|
| JP | 06-094386 | 4/1994 |
| JP | 3010602 | 2/1995 |
| JP | 08-313183 | 11/1996 |
| JP | 10-298686 | 11/1998 |
| JP | 2000-105095 | 4/2000 |
| JP | 2000-161883 | 6/2000 |
| JP | 2001-050690 | 2/2001 |
| JP | 2001-320005 | 11/2001 |
| JP | 2002-26215 | 1/2002 |
| JP | 2002-026215 | 1/2002 |
| JP | 2003-007944 | 1/2003 |
| JP | 2003-019555 | 1/2003 |

* cited by examiner

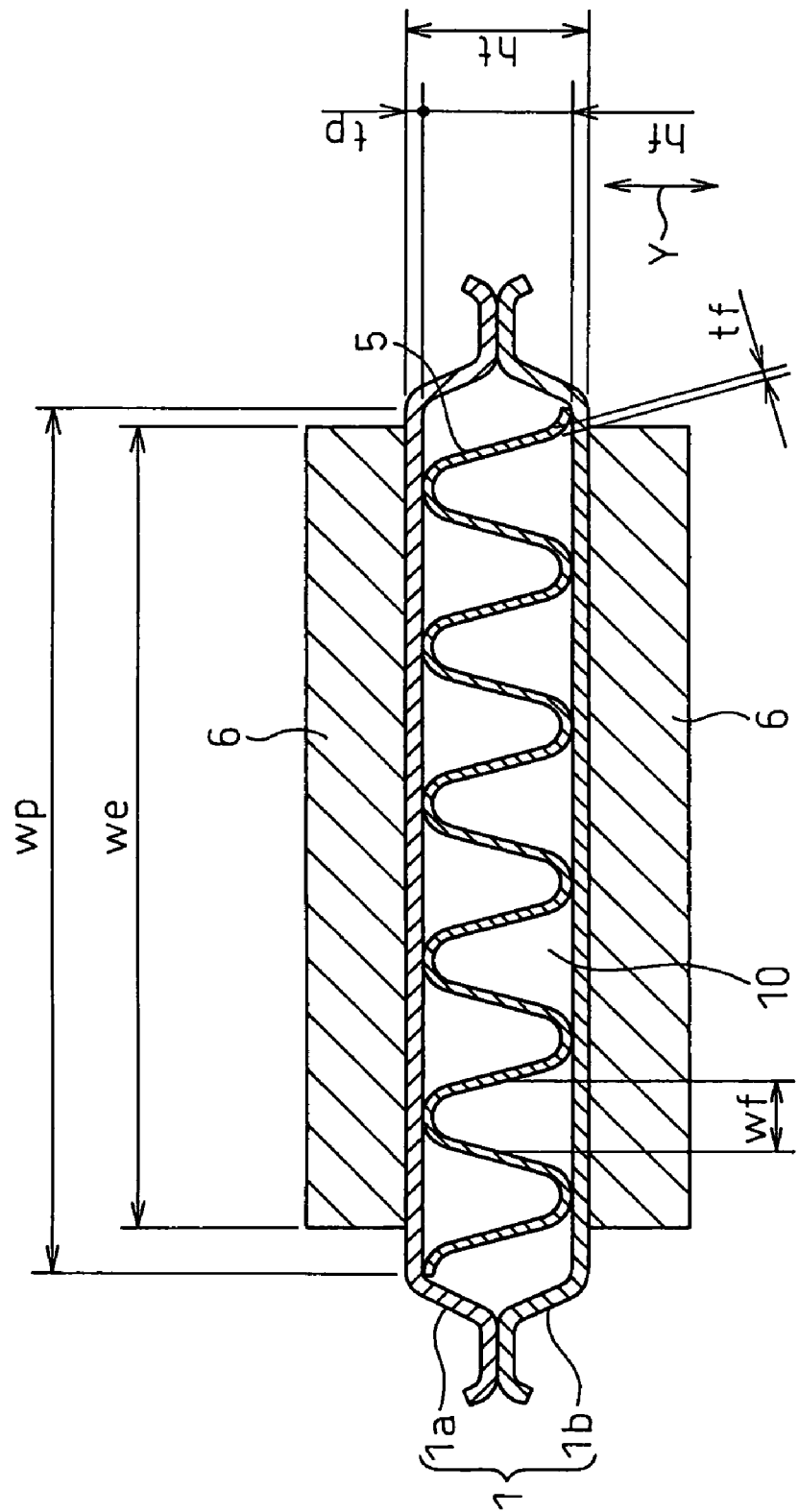

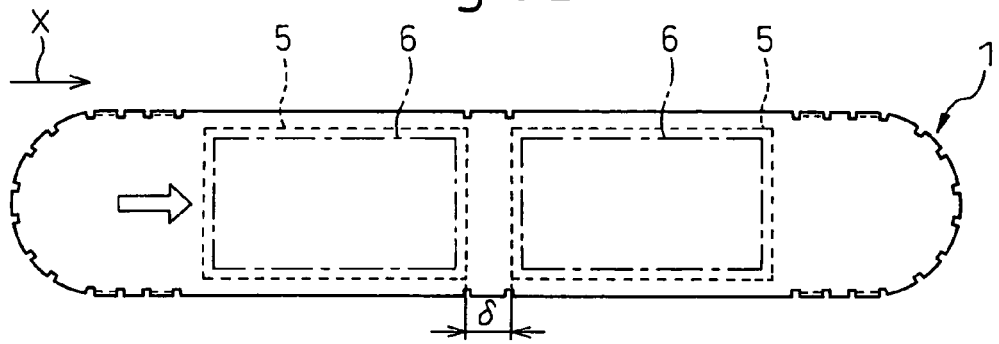
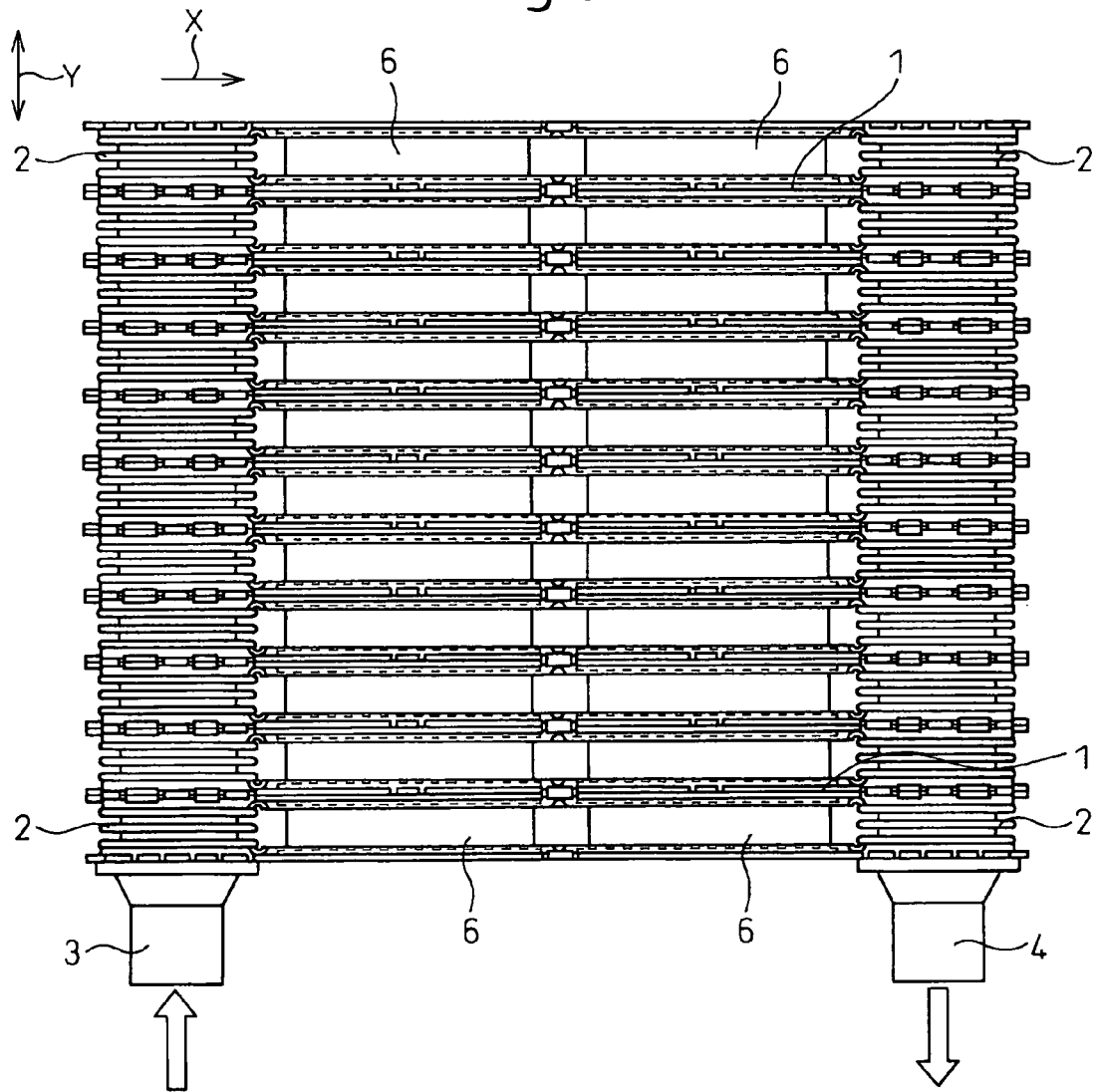

Fig.13A
Fig.13B
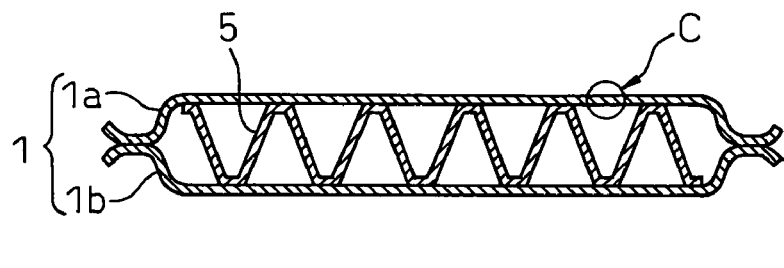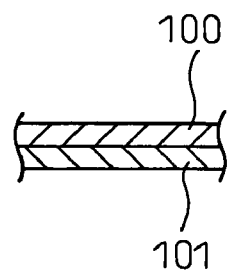
Fig.14A
Fig.14B
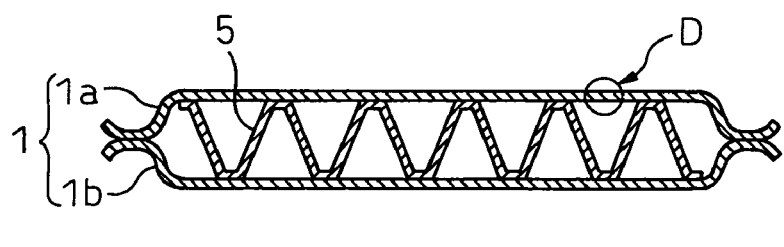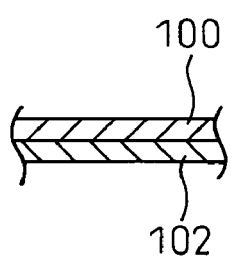
Fig.15A
Fig.15B
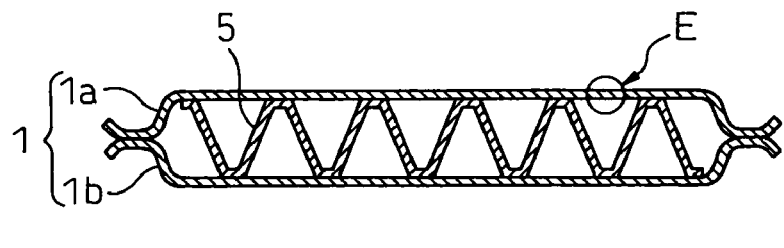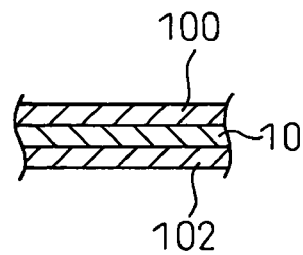

EASILY ASSEMBLED COOLER

CROSS-REFERENCE TO RELATED APPLICATIONS

This application is a divisional of U.S. patent application Ser. No. 11/013,140 filed on Dec. 15, 2004. This application claims the benefit of JP 2004-245140 filed Aug. 25, 2004, JP 2004-177351 filed Jun. 15, 2004, JP 2004-035226 filed Feb. 12, 2004 and JP 2003-421340 filed Dec. 18, 2003. The disclosures of the above applications are incorporated herein by reference.

BACKGROUND OF THE INVENTION

1. Field of the Invention

The present disclosure relates to a cooler for cooling electronic parts and can be preferably used, particularly, as a cooler for cooling electronic parts of a double-sided cooling type in an inverter for a hybrid electric vehicle. More particularly, the present invention relates to a cooler of a built-up type for cooling an electronic part from both sides thereof.

2. Description of the Related Art

Conventionally, a known semiconductor module (an electronic part) is attached to a cooler of a water-cooling type for cooling. A semiconductor device of a double-sided cooling type is proposed in Patent document 1. The device described in Patent document 1 has a configuration in which tubes having a cooling water passage and semiconductor modules of a double-sided cooling type are piled alternately and a pressing force is applied in the direction of built-up of the tubes to hold the semiconductor modules between the tubes. Neighboring tubes and coupled to each other by bellows (coupling means) arranged between the neighboring tubes and by communication holes for making the cooling water passages and the insides of the bellows communicate with each other are formed in respective tubes. In Patent document 1, many examples are described in which the semiconductor module and the tube are brought into close contact with each other even if there are variations in the interval between tubes and in the thickness of the semiconductor modules.

If one of the examples (hereinafter, referred to as a first conventional device), neighboring tubes are coupled to each other by a bellows-shaped elastic cylinder sections and the elastic cylinder sections extend and contract in accordance with the interval between the tubes or the thicknesses of the semiconductor modules.

In another example (hereinafter, referred to as a second conventional device), a flange-shaped cylinder section with low rigidity is provided in the tube and the flange-shaped cylinder section is made to deform in accordance with the interval between the tubes or the thickness of the semiconductor modules.

In still another example (hereinafter, referred to as a third conventional device), the tube is made thinner to have lower rigidity and the tube itself is made to deform in accordance with the interval between tubes or the thickness of the semiconductor module.

Conventionally, a cooler of a built-up type 2009 is known, in which a plurality of cooling tubes 2092 are arranged in layers so as to sandwich and hold an electronic part 2004 from both sides thereof and which cools the electronic part 2004 from both sides thereof, as shown in FIG. 39 (refer to Patent document 2).

The cooler of a built-up type 2009 comprises a supply header 2094 for supplying a cooling medium to the cooling tubes 2092 and a discharge header 2095 for discharging the cooling medium from the cooling tubes 2092. One end of each of the plurality of the cooling tubes 2092 arranged in layers is connected to the supply header 2094 and the other end is connected to the discharge header 2095.

However, in the conventional cooler of a built-up type 2009, the cooling tubes 2092 are connected to the supply header 2094 and the discharge header 2095, both being made of a member different from that of the cooling tubes 2092. Because of this, there is the possibility that the manufacture of the cooler of a built-up type 2009 requires a large number of parts and, therefore, the manufacturing cost thereof is high.

Moreover, in the cooler of a built-up type 2009, the plurality of the cooling tubes 2092 are fixed to the supply header 2094 and the discharge header 2095 and, therefore, it is difficult to change the intervals between the plurality of the cooling tubes 2092. Because of this, it becomes difficult to insert the electronic part 2004 between the cooling tubes 2092 so as to bring the cooling pipes 2092 into close contact with both main surfaces of the electronic part 2004 without fail.

On the other hand, a cooler of a built-up type 2090 is known, which is configured in such a manner that a plurality of the cooling tubes 2092 are arranged so as to sandwich and hold an electronic part 2004 from both sides and, at the same time, a plurality of the cooling tubes 2092 are made to connect with each other via connecting pipe 2093 so that a cooling medium can flow to each cooling tube 2092, as shown in FIG. 40 (refer to Patent document 1).

However, in this cooler of a built-up type 2090 also, it is necessary to join the connecting pipe 2093, which are made of a member different from that of the cooling tubes 2092, to the cooling tubes 2092 to assemble the cooler of a built-up type 2090. Because of this, a problem arises in that the manufacturing cost is high and, at the same time, the productivity is difficult to improve.

[Patent document 1] Japanese Unexamined Patent Publication (Kokai) No. 2002-26215

[Patent document 2] Japanese Unexamined Patent Publication (Kokai) No. 2001-320005

However, as in the device described in Patent document 1, when a tube is manufactured by extrusion, inner walls $2001x$ are formed on the inside of the tube 2001 in order to accelerate heat exchange and to ensure the strength thereof, and the inner walls $2001x$ exist in the entire area in the direction of extrusion, as shown in FIG. 38. In addition, after extrusion, it is necessary to remove the inner wall $2001x$ of the tube 2001 at the portion where the tube 2001 and a bellows are joined, that is, at the portion where a connection hole 2011 is formed. Therefore, this process raises the cost. Moreover, the extruded tube 1 requires side caps and this also raises the cost.

Moreover, the first conventional device and the second conventional device require the elastic cylinder sections or the flange-shaped cylinder sections, the number of which corresponding to the number of piled layers of the tubes and, therefore, a problem arises in that the number of parts of a product is increased.

In the third conventional device, as the tube is deformed in an arc shape, it is not possible for the tube to completely come into close contact with the surface of the semiconductor module and a problem arises in that the contact area between two decreases. Moreover, the third conventional device brings about a problem in that, when the tube deforms, stress tend to concentrate on the joined parts between the tubes and the header tanks.

SUMMARY OF THE INVENTION

The above-mentioned problems being taken into account, an object of the present invention is to provide a cooler capable of reducing the forming process cost and further, the manufacturing cost. Another object of the present invention is to make it possible to ensure a sufficient contact area between an electronic part and a tube without increasing the number of parts.

In order to attain the above-mentioned objects, a cooler according to a first aspect of the present invention comprises: a plurality of tubes (1) internally including a fluid passage (10) through which a cooling fluid flows and piled at predetermined intervals in a direction perpendicular to a direction (X) in which the cooling fluid flows through the fluid passage (10); and coupling means (2) arranged between the neighboring tubes (1) and for coupling the neighboring tubes (1); and in the tube (1), connection holes (11) are formed which make the fluid passage (10) and the inside of the coupling means (2) communicate with each other, electronic parts (6) are held between the neighboring tubes (1), each of the tubes (1) is formed by joining edge parts of plates (1a, 1b, 1c) formed into a predetermined shape by press molding, and fins (5) for accelerating heat exchange are arranged in each of the tube (1).

According to the first aspect, it is possible to dispense with the inner wall, which is required and therefore exists when the tube is manufactured by extrusion and, therefore, a process for removing the inner wall can also be dispensed with. Moreover, it becomes possible to seal the tube without the side cap present in the extruded tube. Still moreover, as the thickness of the plate can be reduced, a process for drilling the connection holes is made easier. Therefore, the forming process (fabrication) cost can be reduced.

As it is possible to form the fin by press molding, as well as the tube, the manufacturing process is made easier and the manufacturing cost can be reduced.

In a second aspect of the present invention, when a semiconductor modules are sandwiched and pressed by plate springs, the fins can deform elastically or buckle without inflicting damage on the semiconductor modules (without destroying circuits, etc.). According to the experimental result, the thickness of the fin in this case was equal to or less than 0.4 mm.

In a third aspect of the present invention, each of the fins (5) is joined to the tube (1) and the portions of the fin (5), which are joined to the tube (1), are arc-shaped.

According to the third aspect, both the fact that the portions of the fin, which are joined to the tube, are arc-shaped and the fact that the tube and the fins can be made thin produce a synergic effect to make it easier for the tubes to deform when an electronic part is held between the tubes and, therefore, the contact surface between the tube and the electronic part is made easier to fit and the adhesiveness is improved. As a result, the contact thermal resistance can be reduced.

In a fourth aspect of the present invention, when viewed in the direction (Y) of built-up of the tubes (1), the fins (5) are arranged at positions at which the fins (5) do not overlap the connection holes (11), and when viewed in a direction (Y) of built-up of the tubes (1), the electronic parts (6) are within the areas of installation of the fins (5).

According to the fourth aspect, the pressure loss can be reduced compared to the case where the fins are present in the entire area in the tube because the fins do not occupy excess area.

In a fifth aspect of the present invention, a plurality of the fins (5) are arranged in the single tube (1) and, at the same time, the fins (5) are arranged at intervals (δ) along the direction (X) in which the cooling fluid flows through the fluid passage (10).

According to the fifth aspect, as the plurality of the fins are arranged in the single tube, it is possible to properly use fins of different heat exchange performance in accordance with, for example, the amount of heat produced by the electronic parts.

By providing the interval, the velocity boundary layer of the cooling fluid is cleared in the interval and the thermal boundary layer of the cooling fluid is also removed and, therefore, the ability to cool the electronic parts on the downstream side of the interval is improved. It is effective for the interval (δ) to be equal to or greater than 1 mm, as shown in a sixth aspect of the present invention.

As shown in a seventh aspect of the present invention, it is possible to reduce the fabrication cost by forming the connection holes (11) by press molding.

As shown in an eighth aspect of the present invention, the tubes (1) may be formed by joining the two plates (1a, 1b). Moreover, as shown in a ninth aspect of the present invention, the tubes (1) may be formed by bending and joining the single plate (1c).

In a tenth aspect of the present invention, the coupling means (2) are bellows. According to the tenth aspect, it is possible to change the dimension between neighboring tubes in accordance with the thickness of an electronic part by extending and contracting the bellows.

In an eleventh aspect of the present invention, the fins (5) are corrugated fins that divide the fluid passage (10) into two or more fine flow passages and the height (hf) of the fins (5) is greater than the width (wf) of the fine flow passage of the fin (5) at the central position of the fine flow passage in a direction of height of the tube.

According to the eleventh aspect, the heat transfer area of the fin is increased and the cooling performance of the cooler is improved. It is preferable that the width (wf) of the fin flow passage be equal to 1.2 mm or less as in a twelfth aspect of the present invention or that the height (hf) of the fin (5) be 1 to 10 mm as in a thirteenth aspect of the present invention.

In a fourteenth aspect of the present invention, the thickness (tf) of the fins (5) is less that the thickness (tp) of the plates (1a, 1b, 1c).

According to the fourteenth aspect, when pressure is applied to an electronic part in order to bring the electronic part into closer contact with the plate surfaces (the tube surfaces), as the fins deform more readily than the plates do, it is made easier for the electronic part and the plate surfaces to come into closer contact and, therefore, the contact thermal resistance is reduced and the cooling efficiency is improved.

It is preferable that the thickness (tf) of the fins (5) be 0.03 to 1.0 mm as in a fifteenth aspect of the present invention or that the thickness (tp) of the plates (1a, 1b, 1c) be 0.1 to 5.0 mm as in a sixteenth aspect of the present invention.

In a seventeenth aspect of the present invention, the tube (1) is formed by brazing the plates (1a, 1b, 1c) and the plates are made of a bare material.

According to the seventeenth aspect, as the plates are made of a bare material, it is unlikely that the plate surface (the tube surface) becomes rough due to brazing. Therefore, the contact thermal resistance between the electronic part and the plates is reduced and the cooling efficiency is improved.

In an eighteenth aspect of the present invention, the tube (1) is formed by brazing the plates (1a, 1b, 1c), the plates (1a, 1b, 1c) are made of a brazing sheet having a core material and a sacrifice anode material, and the tube (1) has the core material at the outside thereof.

According to the eighteenth aspect, the tube can be prevented from being pitted by making the sacrifice anode material first corrode before the core material to prevent the corrosion of the core material of the plate. Moreover, as the core material is located at the outside of the tube, it is unlikely that the plate surface (the tube surface) becomes rough due to brazing and, therefore, the contact thermal resistance between the electronic part and the plates is reduced and the cooling efficiency is improved.

In a nineteenth aspect of the present invention, the tube (1) is formed by brazing the plates (1a, 1b, 1c), the plates (1a, 1b, 1c) are made of a brazing sheet having a core material and a brazing material, and the tube (1) has the core material at the outside thereof.

According to the nineteenth aspect, as the plate is provided with the brazing material, the time (man-hour) for an assembling process including steps, such as a step of attaching a paste brazing material, can be reduced. Moreover, as the core material is located at the outside of the tube, it is unlikely that the plate surface (the tube surface) becomes rough due to the brazing and, therefore, the contact thermal resistance between the electronic part and the plates is reduced and the cooling efficiency is improved.

In a twentieth aspect of the present invention, the tube (1) is formed by brazing the plate (1a, 1b, 1c), the plates (1a, 1b, 1c) are made of a brazing sheet having a sacrifice anode material arranged between a core material and a brazing material, and the tube (1) has the core material at the outside thereof.

According to the twentieth aspect, as the plate is provided with the brazing material, the time (man-hour) for an assembling process including steps, such as a step of attaching a paste brazing material, can be reduced. Moreover, the tube can be prevented from being pitted by making the sacrifice anode material first corrode with priority over the core material to prevent the corrosion of the core material of the plate. Still moreover, as the tube has the core material located at the outside thereof, it is unlikely that the plate surface (the tube surface) becomes rough due to the brazing and, therefore, the contact thermal resistance between the electronic part and the plates is reduced and the cooling efficiency is improved.

In a twenty-first aspect of the present invention, the material of the fins (5) is potentially baser than that of the plates (1a, 1b, 1c). According to the twenty-first aspect, as the fin is made to corrode before the plates, the tube can be prevented from being pitted.

A cooler according to a twenty-second aspect of the present invention comprises: a plurality of flat tubes (501) internally including a fluid passage (501a) through which a cooling fluid flows and piled at predetermined intervals in a direction perpendicular to a direction (X) in which the cooling fluid flows through the fluid passage (501a); and header tanks (503, 505) arranged at both ends of the flat tubes (501) and for distributing and gathering the cooling fluid; and wherein electronic parts (507) arranged between the neighboring flat tubes (501) are held by applying a pressing force thereto in a direction of built-up of the tubes (Y) and the flat tube (501) is provided with narrow parts (501b) that become narrower in the direction of built-up of the tubes (Y).

According to the twenty-second aspect, the flat tube deforms readily in the direction of built-up of the tubes at the narrow parts in accordance with the interval between the flat tubes and the thickness of the electronic part. At this time, the part of the flat tube between the narrow parts does not deform in an arc-shape and, therefore, it is possible for the flat tube and the electronic part to come into close contact with each other at the entire opposing surfaces of both and a sufficient contact area between the electronic part and the tube can be ensured.

As only the narrow parts are formed in the flat tube, the number of parts is not increased in the present embodiment.

Moreover, as the flat tubes readily deform in the direction of built-up of the tubes at the narrow parts, it is unlikely that stress concentrates on the joined parts between the flat tubes and the header tanks when the flat tubes deform and, thus, the stress due to deformation can be reduced.

When the header tank and the flat tube are brazed, the brazing material gathers at the narrow parts and, therefore, the brazing material can be prevented from flowing up to the position of contact between the flat tube and the electronic part.

In a twenty-third aspect of the present invention, the narrow parts (501b) are located at portions at which the electronic parts (507) are not held in the flat tube (501).

According to the twenty-third aspect, it is possible to prevent the contact area between the electronic part and the flat tube from decreasing.

In a twenty-fourth aspect of the present invention, a reinforcement plate (509) having greater rigidity in the direction of built-up of the tubes (Y) than the flat tube (501) is provided at one end in the direction of built-up (Y) of the tubes.

According to the twenty-fourth aspect, it is possible for the cooler itself to support the pressing force in the direction of built-up of the tubes. Moreover, as the strength of the cooler can be increased, it is possible to prevent the cooler itself from deforming when the cooler is transported in a state in which an electronic parts are not held in the cooler yet.

In a twenty-fifth aspect of the present invention, a plurality of rows of electronic parts (507) are arranged when viewed in the direction of built-up of the tubes (Y) and a pressing force is applied to each row independently of each other.

According to the twenty-fifth aspect, as a pressing force is applied to each row independently of each other, even if neighboring electronic parts vary in thickness, the variation can be absorbed and the contact thermal resistance can be reduced.

In a twenty-sixth aspect of the present invention, the narrow parts (501b) extend in a direction perpendicular to the direction of built-up (Y) of the tubes and, at the same time, extending in the direction perpendicular to the direction of flow of the cooling fluid (X) in the fluid passage (501a).

According to the twenty-sixth aspect, it is possible to readily deform the flat tube in the direction of built-up of the tubes at the narrow parts.

In a twenty-seventh aspect of the present invention, the fins (2) for accelerating heat exchange are arranged at positions in the flat tube (1), where the narrow parts (501b) are not formed.

According to the twenty-seventh aspect, during the manufacture process of a cooler, the narrow parts can be used for determining the positions of the fins.

The present invention relates to a cooler of a built-up type for cooling electronic parts from both sides thereof, the cooler of a built-up type comprises: a plurality of flat cooling tubes, each having a refrigerant flow passage through which a cooling medium flows and arranged in layers so as to sandwich and hold the electronic parts at both sides thereof; a supply header section for supplying the cooling medium to the refrigerant flow passage; and a discharge header section for discharging the cooling medium from each of the refrigerant flow passages; wherein each of the cooling tubes is provided with protruding pipe parts opening and protruding toward the direction of built-up of the cooling tubes and neighboring cooling tubes make the refrigerant flow passages thereof communicate with each other by inserting the protruding pipe parts into each other and, at the same time, joining the sidewalls of the protruding pipe parts to each other, and thus forming the supply header section and the discharge header section (the twenty eighth aspect of the present invention).

Next, the functions and effects of the present invention are explained below.

In the cooler of a built-up type, by inserting the protruding pipe parts formed on each of the cooling tubes into each other, the refrigerant flow passages in neighboring cooling tubes are made to connect with each other. Due to this, it is not necessary, in particular, to connect the plurality of cooling tubes via members separately provided and, therefore, the number of parts can be reduced and the manufacture thereof is made easier.

The protruding pipe parts in neighboring cooling tubes are connected by joining the sidewalls of the protruding pipe parts to each other. Therefore, it is possible for the supply header section and the discharge header section to ensure a diameter of a flow passage substantially equal to the inner diameter of the protruding pipe part. Due to this, the flow resistance of the supply header section and the discharge header section can be reduced and the pressure loss can also be reduced. Therefore, it is possible to distribute the cooling medium evenly to each of the plurality of the cooling tubes and, as a result, the electronic parts can be cooled evenly.

As described above, according to the present invention, it is possible to provide a cooler of a built-up type capable of reducing the manufacturing cost.

In a twenty-eighth aspect of the present invention, the electronic part may be, for example, a semiconductor module that incorporates semiconductor elements, such as an IGBT, and diodes. The semiconductor module can be used in an inverter for a vehicle, a motor drive inverter for industrial equipment, an air-conditioner inverter for air-conditioning buildings, etc.

In addition to the semiconductor module described above, a power transistor, a power FET, an IGBT, etc., can be used as the electronic parts.

As the cooling medium described above, for example, water mixed with an ethylene glycol base antifreeze liquid, a natural refrigerant such as water and ammonia, a fluorocarbon base refrigerant such as fluorinate, a chlorofluorocarbon base refrigerant such as HCFC123 and HFC134a, an alcohol-based refrigerant such as methanol and alcohol, and a ketone-based refrigerant such as acetone may be used.

It is preferable that diaphragm parts that deform in the direction of built-up are formed around the protruding pipe parts of the cooling tube (a twenty-ninth aspect of the present invention).

In this case, it is possible to easily adjust the interval between neighboring cooling tubes and to easily and firmly arrange the electronic parts between neighboring cooling tubes. Moreover, it is possible to firmly make the electronic part come into close contact with the cooling tube, or to firmly make the electronic part and the cooling tube come into close contact with a heat transfer member, etc., to be interposed between both.

When arranging electronic parts in the cooler of a built-up type described above, it is possible to sandwich and hold the electronic parts between the cooling tubes by, for example, deforming the diaphragm parts toward the inside of the cooling tube. Moreover, the electronic parts may be sandwiched and held between the cooling tubes by temporarily deforming the diaphragm part toward the outside of the cooling tube to widen the interval between the neighboring cooling tubes and narrowing the interval between the cooling tubes after inserting the electronic part therebetween.

It is preferable that the diaphragm part be formed around one of a pair of the protruding pipes arranged in opposition to each other of the cooling tube and be not formed around the other protruding pipe part (a thirtieth aspect of the present invention).

In this case, it becomes easy to manufacture a cooler of a built-up type so as to have a constant shape in a state in which an electronic parts are sandwiched and held therebetween.

In other words, if the diaphragm parts are provided around both the protruding pipe parts and are deformed, both the diaphragm parts may vary in the amount of deformation from each other. Then, in this case, if an attempt is made to adjust the amount of deformation of each diaphragm part, it becomes necessary to accurately control various conditions, such as the throttle (area-reducing) rate of the cooling tube during press molding and the plate thickness thereof.

Therefore, by providing the diaphragm part to only one of the protruding pipe parts, it becomes easy to perform specific deformation of the diaphragm parts when the electronic parts are sandwiched and held by the cooling tubes substantially in accordance with the design It is preferable that the diaphragm part be formed around the protruding pipe part formed on the downstream side of the supply header section, which is one of the pair of the protruding pipe parts of the cooling tube (a thirty-first aspect of the present invention).

In this case, it is possible to prevent the smooth supply of the cooling medium from the supply header section to the cooling tubes from being blocked by the diaphragm parts.

It is preferable that a throttle (area-reduced) part for narrowing the width of the refrigerant flow passage be provided at the inlet part of the refrigerant flow passage in the cooling tube (a thirty-second aspect of the present invention).

In this case, it becomes easy to make the minimum sectional areas of the flow passages in a plurality of the refrigerant flow passages even and it is possible to make the flow rate of the cooling medium to each of the refrigerant flow passages even.

It is preferable that the cooling tube has a pair of outer shell plates, an intermediate plate arranged between a pair of the outer shell plates, and a corrugated inner fins arranged between the intermediate plate and the outer shell plates (a thirty-third aspect of the present invention).

In this case, it is possible to obtain a cooling tube having a so-called drawn-cup structure by joining the outer shell plates, the intermediate plate, and the inner fins all together after the separate manufacture thereof by means of press molding. Therefore, it is possible to easily manufacture the cooling tube.

It becomes easy to form the inner fins at desired areas. Due to this, for example, it is possible to easily form a supply header section and a discharge header section by not arranging the inner fins at the areas at which the supply header section and the discharge header section are formed.

In this case, two rows of the refrigerant flow passages are formed in the direction of built-up of the cooling tubes, as a result. Therefore, it is possible to prevent the transfer of heat between the electronic parts arranged at both sides of the cooling tube. As a result, it is possible, for example, to prevent the rapid rise in temperature of one of the electronic parts from affecting the other electron part.

It is preferable that the outer shell plates are made of a brazing sheet having a core material and a brazing metal arranged on an inner surface of the core material, the intermediate plate and the inner fins are made of a metal plate including a metal baser than the core material of the outer shell plates, and a pair of the outer shell plates are joined to each other at the inner surfaces thereof at the ends (a thirty-fourth aspect of the present invention).

In this case, it is possible to prevent the outer shell plates from corroding by making the inner fins and the intermediate plate corrode before the outer shell plates. Due to this, it is possible to prevent the cooling medium from leaking out from the cooling tubes.

The brazing material is arranged on the joined surface between a pair of the outer shell plates and, therefore, it is possible to easily join a pair of the outer shell plates by brazing and to easily manufacture the cooling tube.

The description "a metal baser than the core material" means a metal, the corrosion potential of which is lower than that of the metal used as the core material. For example, when aluminum (Al) is used as the core material and the brazing material, a metal material, which is aluminum added with zinc (Zn) can be used as a metal plate used for the intermediate plate and the inner fin.

It is preferable that the outer shell plates are made of a brazing sheet having a core material, a sacrifice anode material arranged on the inner surface of the core material, and the brazing material arranged on the inner surface of the sacrifice anode material. (a thirty-fifth aspect of the present invention).

In this case, it is possible to prevent the core material from corroding by making the sacrifice anode material corrode first before the core material in the outer shell plate. Due to this, it is unlikely that corrosion advances in the direction of thickness of the outer shell plate and it is possible to prevent the cooling tube from being pitted.

For example, when aluminum (Al) is used as the core material, a meta material, which is aluminum added with zinc (Zn) can be used as the sacrifice anode material.

It is preferable that the outer shell plates are made of a brazing sheet having a core material and a sacrifice anode material arranged on the inner surface of the core material, the intermediate plate is made of a brazing sheet having core material and brazing materials arranged on both surfaces of the core material, the inner fins are made of a metal plate including a metal baser than the core material of the outer shell plate, and a pair of the outer shell plates are formed by joining the inner surface at ends thereof to both surfaces at the ends of the intermediate plate (a thirty-sixth aspect of the present invention).

In this case, it becomes possible to cover the entire inner surface of the cooling tube with the sacrifice anode material, and it is possible to prevent the core material of the outer shell plates from corroding and also to prevent the cooling tube from being pitted.

Moreover, a pair of the outer shell plates are joined to the end parts of both surfaces of the intermediate plate, both surfaces of which are provided with the brazing material. Therefore, it is possible to easily join a pair of the outer shell plates to the intermediate plate by brazing and, therefore, to easily manufacture the cooling tube.

It is preferable that a first cooling tube, which has been arranged at one end in the direction of built-up of a plurality of the cooling tubes, has a refrigerant introduction inlet for introducing the cooling medium to the supply header section and a refrigerant discharge outlet for discharging the cooling medium from the discharge header section and, at the same time, the refrigerant introduction inlet and the refrigerant discharge outlet have a protruding opening part protruding toward the outside of the first cooling tube, and a refrigerant introduction pipe and a refrigerant discharge pipe are inserted into the protruding opening parts at the refrigerant introduction inlet and the refrigerant discharge outlet, respectively (a thirty-seventh aspect of the present invention).

In this case, it is possible to prevent the flow passage between the supply header section and the refrigerant flow passage or between the discharge header section and the refrigerant flow passage from being blocked by the above-mentioned refrigerant introduction pipe or the refrigerant discharge pipe. Due to this, it is possible for the first cooling tube also to ensure the sectional area of the flow passage similar to that of other cooling tubes and it becomes possible to evenly cool the electronic parts.

The above-mentioned protruding opening part can be formed by means of, for example, burring process by erecting the protruding opening part on the main surface of the cooling tube substantially vertically. Moreover, the protruding opening part can be made to protrude, for example, 2 mm.

The symbols in the parenthesis attached to each means indicate the relationship of correspondence with specific means in embodiments, which will be described later.

The present invention may be more fully understood from the description of the preferred embodiments of the invention set forth below, together with the accompanying drawings.

BRIEF DESCRIPTION OF THE DRAWINGS

FIG. 2 is a sectional view of an important part, along the I-I line in FIG. 1.

FIG. 9A is a front view of a cooler according to a second embodiment of the present invention.

FIG. 9B is a plan view of the cooler in FIG. 9A.

FIG. 13A is a sectional view of a tube alone in a cooler according to a sixth embodiment of the present invention.

FIG. 13B is an enlarged sectional view of part C in FIG. 13A.

FIG. 14A is a sectional view of a tube alone in a cooler according to a seventh embodiment of the present invention.

FIG. 14B is an enlarged sectional view of part D in FIG. 14A.

FIG. 15A is a sectional view of a tube alone in a cooler according to an eighth embodiment of the present invention.

FIG. 15B is an enlarged sectional view of part E in FIG. 15A.

DESCRIPTION OF THE PREFERRED EMBODIMENTS

[First Embodiment]

Figure 1:
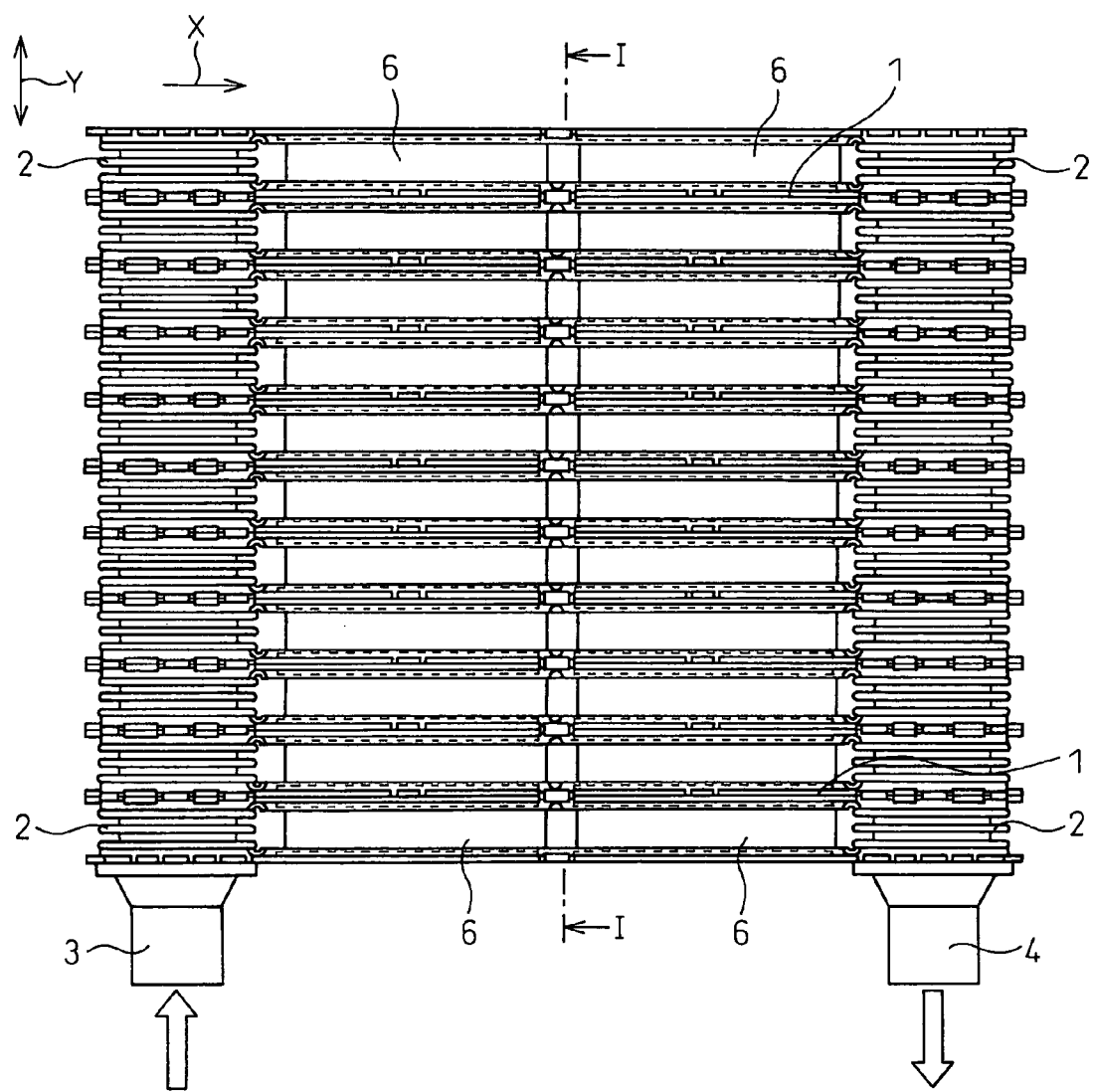
FIG. 1 is a front view of a cooler according to a first embodiment of the present invention.
Figure 3B:
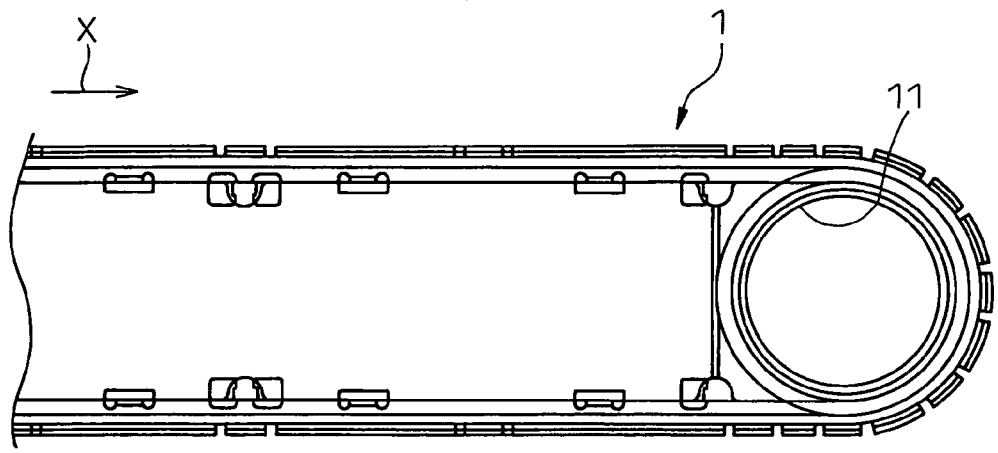
FIG. 3B is a plan view of the tube in FIG. 3A.
Figure 3A:
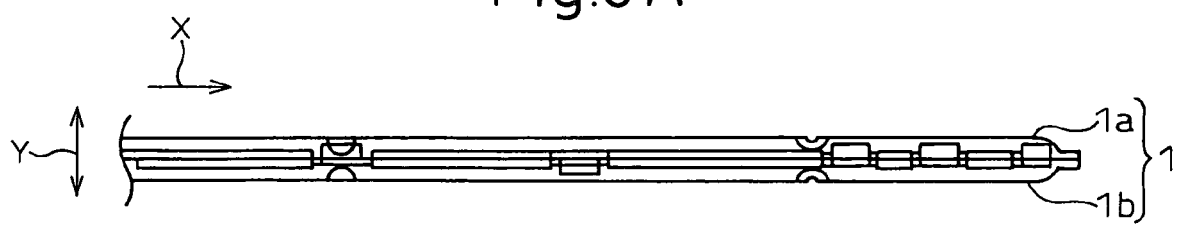
FIG. 3A is a front view of a tube alone in FIG. 1.

A cooler according to a first embodiment of the present invention is explained below. FIG. 1 is a front view of the cooler according to the first embodiment, FIG. 2 is a sectional view of an important part along the I-I line in FIG. 1, FIG. 3A is a front view of a tube alone in FIG. 1, FIG. 3B is a plan view of the tube in FIG. 3A, and FIG. 4 is an enlarged view of an important part of a fin in FIG. 2.

The cooler of the present invention can be used to cool a semiconductor module of a double-sided cooling type in an inverter for a hybrid electric vehicle.

As shown in FIG. 1 and FIG. 2, the cooler comprises: a plurality of tubes 1 in which a fluid passage 10 is formed internally through which a cooling fluid flows and piled at predetermined intervals in the direction Y (hereinafter, referred to as the direction of built-up Y) perpendicular to the direction X (hereinafter, referred to as the direction of flow X) of flow of the cooling fluid in the fluid passage 10; bellows 2 arranged between neighboring tubes 1 and coupling the neighboring tubes 1; an inlet pipe 3 joined by brazing to the tube 1 located at the end in the direction of built-up Y and into which the cooling fluid flows; an outlet pipe 4 joined by brazing to the tube 1 located at the end in the direction of built-up Y and from which the cooling fluid flows out; and fins 5 arranged within the fluid passage 10 and accelerating heat exchange. The bellows 2 correspond to coupling means of the present invention. As the cooling fluid, water mixed with an ethylene glycol base antifreeze liquid is used in the present embodiment.

Figure 4:
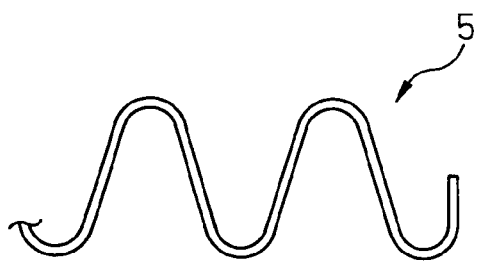
FIG. 4 is an enlarged view of an important part of an inner fin in FIG. 2.

As shown in FIG. 2 to FIG. 4, the tube 1 comprises two plates 1a and 1b, which are made by forming a thin plate made of aluminum into a predetermined shape by press molding, and is formed by joining by brazing the edges of the two plates 1a and 1b in a state in which the fin 5, which is made by forming a thin plate made of aluminum into a corrugated plate by press molding, is sandwiched between the two plates 1a and 1b. It is preferable that the plates 1a and 1b and the fin 5 use a brazing sheet material with a sacrifice anode material attached to the inside thereof, in order to prevent pitting corrosion. The joined part is brazed using a paste brazing material, etc. Moreover, it is also preferable that the fin uses a brazing sheet material, both surfaces of which are clad with a brazing material.

In the tube 1, circular connection holes 11, which allow the fluid passage 10 and the inside of the bellows 2 to connect with each other, are formed at both ends in the direction of the cooling fluid flow within the fluid passage 10 and, at the same time, at the end faces in the direction of built-up Y. The connection holes 11 are formed by press molding before joining by brazing.

The bellows 2 is a bellows-shaped pipe and can extend and contract readily in the direction of built-up Y. In addition, the bellows 2 is made of aluminum and is joined by brazing to the tubes 1 so as to surround each of the connection holes 11 of the tube 1 adjacent thereto.

The inlet pipe 3 and the outlet pipe 4 are made of aluminum, and inserted into the connection holes 11 of the tube 1 located at the end in the direction of built-up Y and are joined by brazing to the tube 1. The inlet pipe 3 and outlet pipe 4 are connected to a pump (not shown) for circulating the cooling fluid and a heat exchanger (not shown) for cooling the cooling fluid.

The fin 5 is partly joined by brazing to the tube 1 and the portions of the fin 5, which are joined to the tube 1, are formed into an arc shape. The fins 5 are arranged in areas so that the fins 5 do not overlap the connection holes 11 when viewed in the direction of built-up Y. In addition, the fin 5 divides the fluid passage 10 within the tube 1 into a plurality of fine (small) flow passages.

A semiconductor module of a double-sided cooling type 6, which is a heat producing body, incorporates an IGBT element and a diode, corresponding to an electronic part according to the present invention. As shown in FIG. 1, the semiconductor module 6 is arranged between neighboring tubes 1 and the tubes 1 and the semiconductor module 6 come into contact with each other directly, or via an insulating material (a ceramic plate, in most cases) or a thermally conductive grease. The semiconductor module 6 is held between the tubes 1 by sandwiching and pressing the piled tubes 1 from both ends in the direction of built-up Y using plate springs, not shown.

In the above-mentioned configuration, the cooling fluid that has flowed in from the inlet pipe 3 flows into one end of the fluid passage 10 of each of the tubes 1 through the bellows 2, flows through the fluid passage 10 along the direction of flow X, and reaches the outlet pipe 4 through the bellows 2 from the other end of the fluid passage 10. Then, heat exchange is effected between the cooling fluid flowing through the fluid passage 10 and the semiconductor module 6 and, thus, the semiconductor module 6 is cooled.

In order to reduce the temperature of the semiconductor module 6 below the warranty temperature, the specifications of the plates 1a and 1b and the fin 5 are designed and optimized so that a temperature Tw (hereinafter, referred to as a tube surface temperature) at the portion of the tube 1, with which the semiconductor module 6 comes into contact, falls below a predetermined temperature (110° C., in the present embodiment).

The result of the discussion on the specifications of the plates 1a and 1b and the fin 5 is explained below. Here, a fin flow passage width wf, a fin height hf, a fin plate thickness tf, and a plate thickness tp are discussed. The fin flow passage width wf is a dimension in the direction perpendicular to both the direction of flow X and the direction of built-up Y, at a central position in the direction of fin height in the fine flow passage.

The design conditions are as follows: the temperature of the cooling fluid that flows into the cooler is 65° C.; the heating value of the semiconductor module 6 is 400 W/unit; and the flow rate of the cooling fluid in the single tube 1 is a constant value of 1 L/min. In addition, the relationship between a plate width wp and a width we of the semiconductor module 6 is determined so that wp>we holds. The plate width wp is a dimension in the direction perpendicular to both the direction of flow X and the direction of built-up Y in a flat surface of the tube 1 in opposition to the semiconductor module 6. The width we of the semiconductor module 6 is a dimension thereof in the direction perpendicular to both the direction of flow X and the direction of built-up Y.

Figure 5:
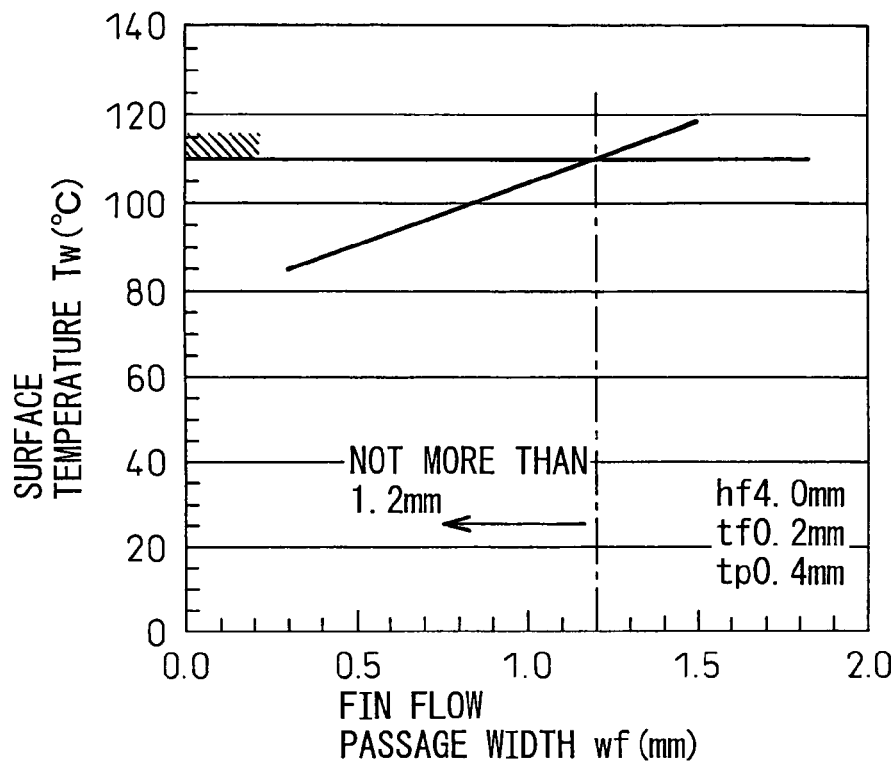
FIG. 5 is a diagram showing a relationship between the fin flow passage width wf and the tube surface temperature Tw.

FIG. 5 shows the tube surface temperature Tw when the fin flow passage width wf is varied. Here, the fin height hf is set to 4.0 mm, the fin plate thickness tf is set to 0.2 mm, and the plate thickness tp is set to 0.4 mm.

From the result, it is found possible to reduce the tube surface temperature Tw to 110° C. or lower by setting the fin flow passage width wf to 1.2 mm or less. It is preferable that the fin flow passage width wf be about 0.9 mm if clogging with foreign matter and the cooling performance are taken into account.

Figure 6:
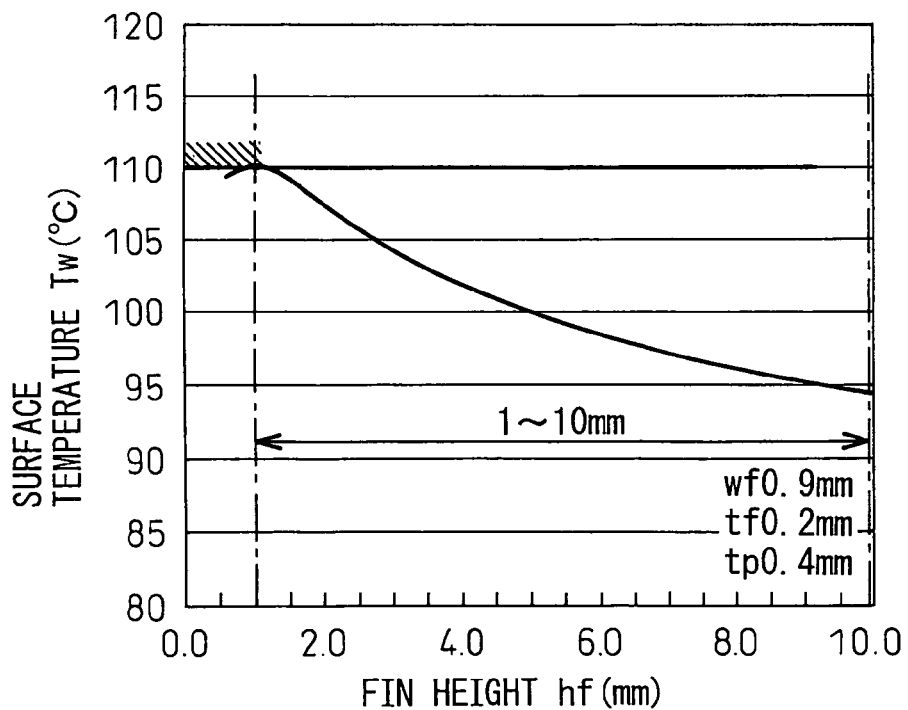
FIG. 6 is a diagram showing a relationship between the fin height hf and the tube surface temperature Tw.

FIG. 6 shows the tube surface temperature Tw when the fin height hf is varied. Here, the fin flow passage width wf is set to 0.9 mm, the fin plate thickness is set to 0.2 mm, and the plate thickness tp is set to 0.4 mm.

From the result, it is found possible to reduce the tube surface temperature Tw to 110° C. or lower by setting the fin height hf to 1 mm to 10 mm. It is preferable that the fin height hf be about 4 mm if the dimension of the cooler in the direction of built-up Y and cooling performance are taken into account.

Figure 7:
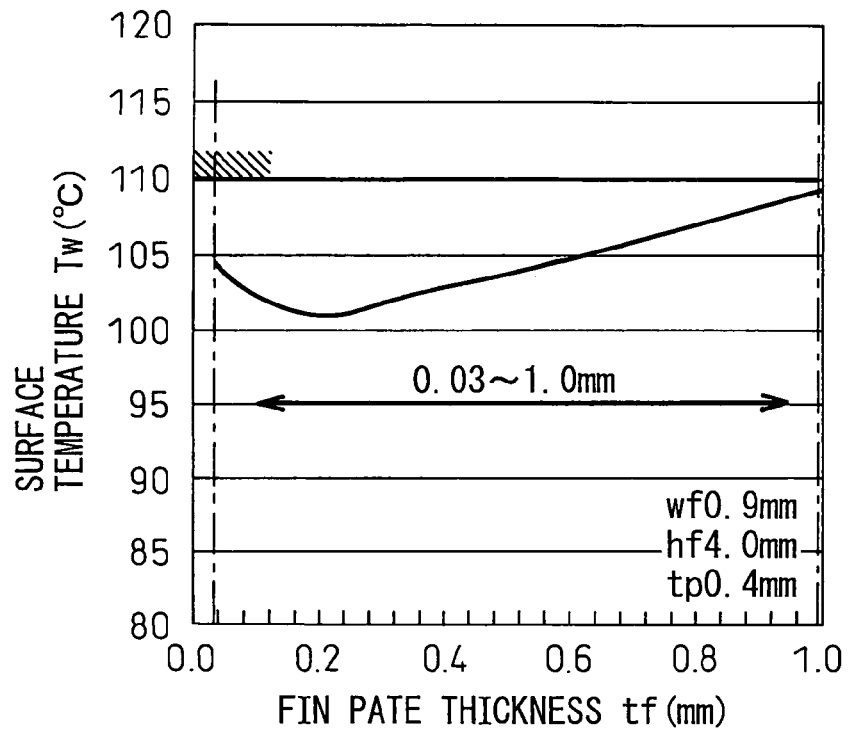
FIG. 7 is a diagram showing a relationship between the fin plate thickness tf and the tube surface temperature Tw.

FIG. 7 shows the tube surface temperature Tw when the fin plate thickness tf is varied. Here, the fin flow passage width wf is set to 0.9 mm, the fin height hf is set to 4.0 mm, and the plate thickness tp is set to 0.4 mm.

From the result, it is found possible to reduce the tube surface temperature Tw to 110° C. or lower by setting the fin plate thickness tf to 1 mm or less. It is most preferable that the fin plate thickness tf be 0.2 mm from the standpoint of cooling performance. Currently, the limit of the plate thickness is about 0.03 mm.

Figure 8:
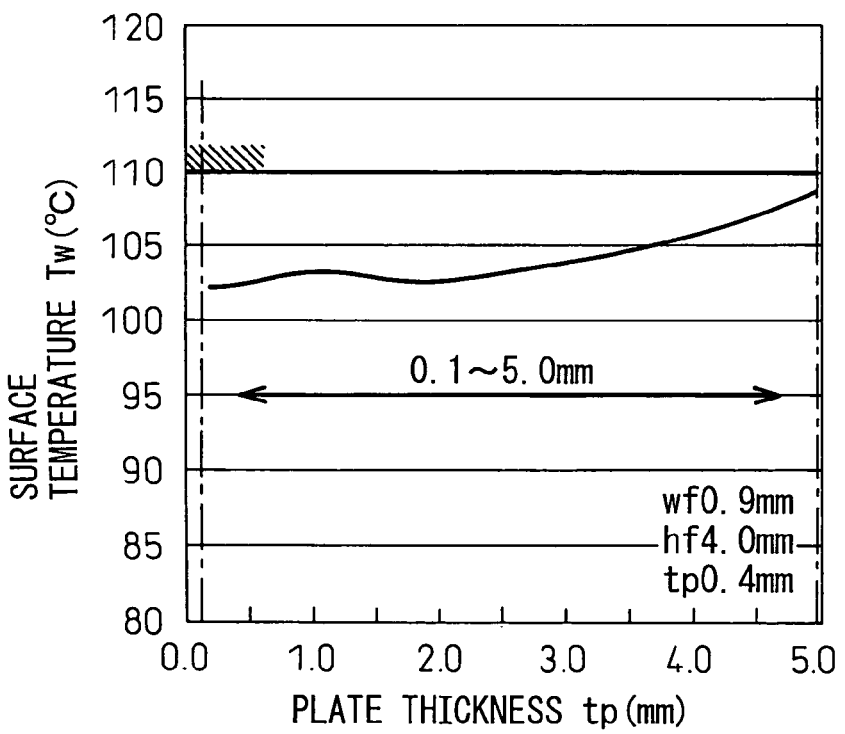
FIG. 8 a diagram showing a relationship between the plate thickness tp of plates 1a and 1b and the tube surface temperature Tw.

FIG. 8 shows the tube surface temperature Tw when the plate thickness tp is varied. Here, the fin flow passage width wf is set to 0.9 mm, the fin height hf is set to 4.0 mm, and the fin plate thickness tf is set to 0.2 mm.

From the result, it was found possible to reduce the tube surface temperature Tw to 110° C. or lower by setting the plate thickness tp to 5 mm or less. It is preferable that the plate thickness tp be 0.1 mm or greater from the standpoint of moldability in the press working and that the plate thickness tp be about 0.4 mm if the ease of fitting between the semiconductor module 6 and the surfaces of the plates 1a and 1b (the tube surface) and moldability are taken into account.

In the present embodiment, as the tube 1 is formed by joining the edges of the two plates 1a and 1b formed by press molding, the inner wall of the coupling part that exists when the tube is manufactured by extrusion can be removed and it is no longer necessary to remove the inner wall by machining. Moreover, as the plate thickness of the plates 1a and 1b can be reduced, drilling the connection holes 11 is made easy. Therefore, the fabrication cost can be reduced.

As the fin 5, as well as the tube 1, can also be formed by press molding, the manufacturing process is simplified and the manufacturing cost can be reduced.

Both the fact that the portion of the fin 5, which is joined to the tube 1, is arc-shaped and the fact that the tube 1 and the fin 5 can be made thin produce a synergic effect to make it easier for the tube 1 to deform when the semiconductor module 6 is held between the tubes 1 and, therefore, the opposing contact surfaces of the tube 1 and the semiconductor module 6 are made easier to fit with each other and the adhesiveness thereof is improved. As a result, the contact thermal resistance thereof can be reduced.

As the plate thickness of the plates 1a and 1b can be reduced, the sectional area of the flow passage of the fluid passage 10 can be increased accordingly. As a result, the flow resistance thereof can be reduced and the power of the pump required to circulate the cooling fluid can also be reduced.

As the fins 5 are arranged in areas in which the fins 5 do not overlap the connection holes 11 when viewed in the direction of built-up Y of the tubes 1, the fins 5 do not occupy any excess area and, therefore, the pressure loss can be reduced accordingly compared to the case where the fin 5 occupies the entire area within the tube 1.

As the bellows 2 can extend and contract readily in the direction of built-up Y, it is possible to easily vary the distance between neighboring tubes 1 in accordance with the thickness of the semiconductor module 6 when sandwiching and pressing the laminated (piled) tubes 1 in the direction of built-up Y using the plate springs.

As the fin height hf is set greater than the fin flow passage width wf, the heat transfer area of the fin 5 increases and the cooling performance improves.

As the fin plate thickness tf is set to less than the plate thickness tp, when the semiconductor module 6 is made to come into closer contact with the surfaces of the plates 1a and 1b (the surfaces of the tube 1) by applying pressure to the semiconductor module 6, the surfaces of the semiconductor module 6 and the plates 1a and 1b become easier to fit with each other because the fin 5 is easier to deform compared to the plates 1a and 1b, and, therefore, the contact thermal resistance therebetween is reduced and the cooling efficiency is improved.

[Second Embodiment]

A cooler according to a second embodiment of the present invention is explained below. FIG. 9A is a front view of the cooler according to the second embodiment and FIG. 9B is a plan view of the cooler in FIG. 9A. The same numerals or letters are assigned to the parts the same as or similar to those in the first embodiment and no explanation thereof will be given here.

In FIG. 9B, the broken line denotes the position at which the fin 5 is arranged and the alternate long and short dash line denotes the position at which the semiconductor module 6 is arranged. As shown in FIG. 9B, the two fins 5 are arranged in the single tube 1 and the two fins 5 are arranged apart from each other at an interval δ, along the direction of flow X of the cooling fluid within the fluid passage 10. The semiconductor module 6 is arranged within the area in which the fin 5 is arranged when viewed in the direction of built-up Y of the tubes 1.

In the present embodiment, as the two fins 5 are arranged in the single tube 1, it is possible to properly use the two fins 5 having different heat exchange performance according to the heating value, etc. of the semiconductor module.

As the cooling fluid receives the heat generated by the semiconductor module 6 on the upstream side and rises in temperature, the semiconductor module 6 on the downstream side relatively rises in temperature accordingly, but it is possible to improve the cooling performance of the semiconductor module 6 on the downstream side by changing the type of the fin 5 on the downstream side to a type having higher performance (for example, an offset fin). When the semiconductor module 6 on the upstream side has a high heating value, the cooling performance can be improved by arranging the fin 5 having higher performance on the upstream side.

By providing the intervals δ, the velocity boundary layer of the cooling fluid is cleared in the interval and the thermal boundary layer of the cooling fluid is also removed and, therefore, the ability to cool the semiconductor module 6 on the downstream side of the interval δ is improved. It is effective for the interval δ to be equal to or greater than 1 mm.

[Third Embodiment]

Figure 10:
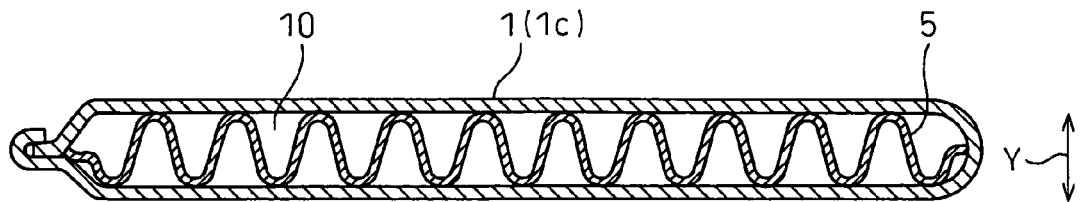
FIG. 10 is a sectional view of a tube alone in a cooler according to a third embodiment of the present invention.

A cooler according to a third embodiment of the present invention is explained below. FIG. 10 is a sectional view of a tube in the cooler according to the third embodiment. In the present embodiment, the configuration of the tube 1 differs from that in the first embodiment but the other parts are the same as those in the first embodiment.

As shown in FIG. 10, the tube 1 in the present embodiment is formed by bending a plate 1c, which is a thin plate formed into a predetermined shape by press molding, and joining by brazing the edges of the plate 1c in a state in which the fin 5 is sandwiched between the bent plate 1c.

According to the present embodiment, it is possible to reduce the number of parts, the time of the fabricating process and, therefore, the cost compared to the first embodiment in which the tube 1 is formed by the two plates 1a and 1b. It is preferable that the plate 1c uses a brazing sheet material having a sacrifice anode material attached to the inside thereof in order to prevent the pitting corrosion and a brazing material attached to the outside thereof in order to effectively perform the joining, respectively. It is also preferable that the fin use a brazing sheet having both surfaces clad with a brazing material.

[Fourth Embodiment]

Figure 11A:
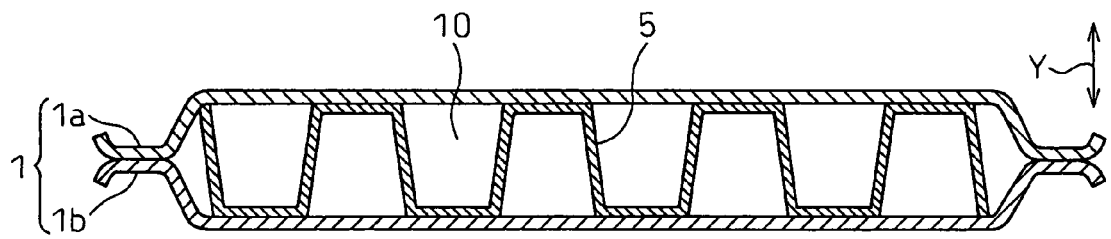
FIG. 11A is a sectional view of a tube 1 in a free state in a cooler according to a fourth embodiment of the present invention.
Figure 11B:
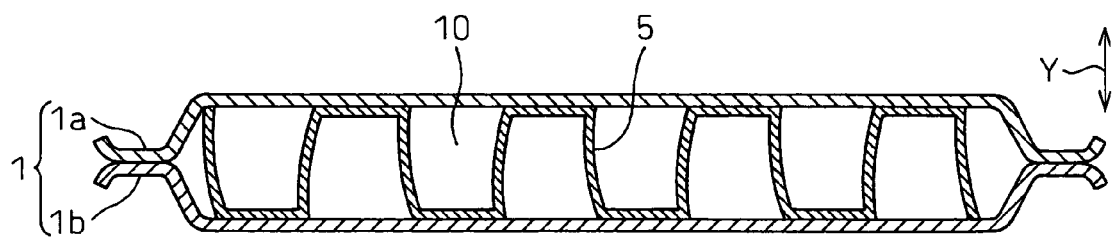
FIG. 11B is a sectional view of a fin 5 in a state of being buckled.

A cooler according to a fourth embodiment of the present invention is explained below. FIG. 11A is a sectional view of the tube 1 in the cooler according to the fourth embodiment in a free state and FIG. 11B is a sectional view in a state in which the fin 5 is deformed by buckling force. In the present embodiment, the configuration of the fin 5 differs from that in the first embodiment and other parts are the same as those in the first embodiment.

In the first embodiment, the arc-shaped fin 5, the portion of which to be joined to the tube 1 has been formed into an arc shape, is used, but in the present embodiment, a rectangular fin 5, the portion of which to be joined to the tube 1 has been formed into a flat shape as shown in FIG. 11A, is used.

An experiment was conducted as follows. An electronic part (not shown) was sandwiched from both sides thereof by the tubes 1 according to the present embodiment and stress was applied in the direction of built-up Y. The result was that when the thickness of the fin 5 was 0.4 mm or less, the fin 5 buckled without inflicting damage (for example, the destruction of the circuit) on the electronic part.

From the comparison between the rectangular fin (according to the present embodiment) and the arc-shaped fin (according to the first embodiment) having the same thickness of 0.4 mm and the same pitch, it was found that the arc-shaped fin deformed under less stress than the rectangular fin and the arc-shaped fin was more preferable in shape to reduce the stress applied to the electronic part.

[Fifth Embodiment]

Figure 12A:
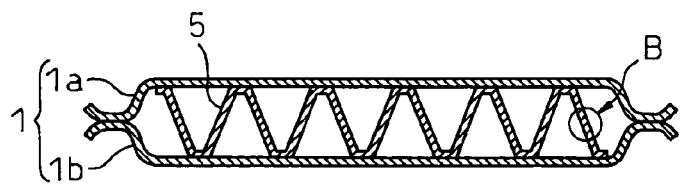
FIG. 12A is a sectional view of a tube alone in a cooler according to a fifth embodiment.
Figure 12B:
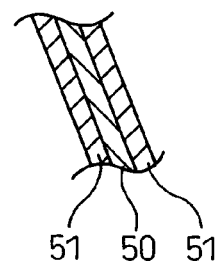
FIG. 12B is an enlarged sectional view of part B in FIG. 12A.

A cooler according to a fifth embodiment of the present invention is explained below. FIG. 12A is a sectional view of a tube alone in the cooler according to the fifth embodiment and FIG. 12B is an enlarged sectional view of part B in FIG. 12A. In the present embodiment, the configurations of the tube 1 and the fin 5 differ from those in the first embodiment and the other parts are the same as those in the first embodiment.

The plates 1a and 1b in the present embodiment are each made of a bare material made of aluminum, and the fin 5 is made of a brazing sheet, which comprises an aluminum core material 50 and brazing materials 51 coated on the both sides thereof. Zinc (Zn) is added to the core material 50. The plates 1a and 1b and the fin 5 are joined by the brazing materials 51 of the fin and the two plates 1a and 1b are joined by a paste brazing material, a pre-placed brazing material, or the like. The melting point of the brazing materials 51 is lower than the melting point of the core material 50 of the fin 5 and the melting point of the plates 1a and 1b.

According to the present embodiment, as the plates 1a and 1b are each made of a bare material, it is unlikely that the surfaces of the plate 1a and 1b (the surface of the tube 1) become rough due to brazing and, therefore, the contact thermal resistance between the semiconductor module 6 and the plates 1a and 1b is reduced and the cooling efficiency is improved.

As zinc (Zn) is added to the core material 50 of the fin 5, the fin 5 becomes potentially baser than the plates 1a and 1b. Therefore, the fin 5 corrodes before the plates 1a and 1b and it is possible to prevent the tube 1 from being pitted.

[Sixth Embodiment]

A cooler according to a sixth embodiment of the present invention is explained below. FIG. 13A is a sectional view of a tube alone in the cooler according to the sixth embodiment and FIG. 13B is an enlarged sectional view of part C in FIG. 13A. In the present embodiment, the configurations of the tube 1 and the fin 5 differ from those in the first embodiment and the other parts are the same as those in the first embodiment.

The plates 1a and 1b in the present embodiment are each made of a brazing sheet, which is an aluminum core material 100 one side of which is coated with a sacrifice anode material 101, and both plates are joined so that the core material 100 is located on the outside and the sacrifice anode material 101 is located on the inside. The sacrifice anode material 101 is potentially (electrically) baser than the core material 100. The fin 5 is identical to the fin 5 in the fifth embodiment.

According to the present embodiment, even after the fin 5 has corroded completely, the sacrifice anode material 101 corrodes before the core material 100 in the plates 1a and 1b and, therefore, the core material 100 of the plates 1a and 1b can be prevented from corroding and the tube 1 can be prevented from being pitted.

As the plates 1a and 1b are joined so that the core material 100 is located on the outside, it is unlikely that the surfaces of the plates 1a and 1b (the surface of the tube 1) become rough due to the brazing and, therefore, the contact thermal resistance between the semiconductor module 6 and the plates 1a and 1b is reduced and the cooling efficiency is improved.

As Zn is added to the core material 50 of the fin 5, the fin 5 becomes potentially baser than the plates 1a and 1b. Therefore, the fin 5 corrodes before the plates 1a and 1b and it is possible to prevent the tube 1 from being pitted.

[Seventh Embodiment]

A cooler according to a seventh embodiment of the present invention is explained below. FIG. 14A is a sectional view of a tube in the cooler according to the seventh embodiment and FIG. 14B is an enlarged sectional view of part D in FIG. 14A. In the present embodiment, the configurations of the tube 1 and the fin 5 differ from those in the first embodiment and the other parts are the same as those in the first embodiment.

The plates 1a and 1b in the present embodiment are each made of a brazing sheet, which is the aluminum core material 100 one side of which has been coated with a brazing material 102, and both plates are joined so that the core material 100 is located on the outside and the brazing material 102 is located on the inside. The fin 5 is identical to the fin 5 in the fifth embodiment.

According to the present embodiment, as the plates 1a and 1b are coated with the brazing material 102, the time (man-hour) of assembling processes such as a process in which a paste brazing material is attached can be reduced.

As the plates 1a and 1b are joined so that the core material 100 is located on the outside, it is unlikely that the surfaces of the plates 1a and 1b (the surface of the tube 1) become rough due to the brazing and, therefore, the contact thermal resistance between the semiconductor module 6 and the plates 1a and 1b is reduced and the cooling efficiency is improved.

As Zn has been added to the core material 50 of the fin 5, the fin 5 becomes potentially baser than the plates 1a and 1b. Therefore, the fin 5 corrodes before the plates 1a and 1b and it is possible to prevent the tube 1 from being pitted.

[Eighth Embodiment]

A cooler according to an eighth embodiment of the present invention is explained below. FIG. 15A is a sectional view of a tube in the cooler according to the eighth embodiment and FIG. 15B is an enlarged sectional view of part E in FIG. 15A. In the present embodiment, the configurations of the tube 1 and the fin 5 differ from those in the first embodiment but the other parts are the same as those in the first embodiment.

The plates 1a and 1b in the present embodiment are each made of a brazing sheet, in which the sacrifice anode material 101 is arranged between the aluminum core material 100 and the brazing material 102, and both plates are joined so that the core material 100 is located on the outside and the brazing material 102 is located on the inside. The fin 5 is identical to the fin 5 in the fifth embodiment.

According to the present embodiment, as the plates 1a and 1b are coated with the brazing material 102, the time (man-hour) of assembling processes, such as a process in which a paste brazing material is attached, can be reduced.

Moreover, even after the fin 5 has corroded completely, the sacrifice anode material 101 corrodes before the core material 100 in the plates 1a and 1b and, therefore, the core material 100 of the plates 1a and 1b can be prevented from corroding and it is possible to prevent the tube 1 from being pitted.

As the plates 1a and 1b are joined so that the core material 100 is located on the outside, it is unlikely that the surfaces of the plates 1a and 1b (the surface of the tube 1) become rough due to the brazing and, therefore, the contact thermal resistance between the semiconductor module 6 and the plates 1a and 1b is reduced and the cooling efficiency is improved.

As Zn has been added to the core material 50 of the fin 5, the fin 5 becomes potentially baser than the plates 1a and 1b. Therefore, the fin 5 corrodes before the plates 1a and 1b and it is possible to prevent the tube 1 from being pitted.

[Ninth Embodiment]

Figure 16:
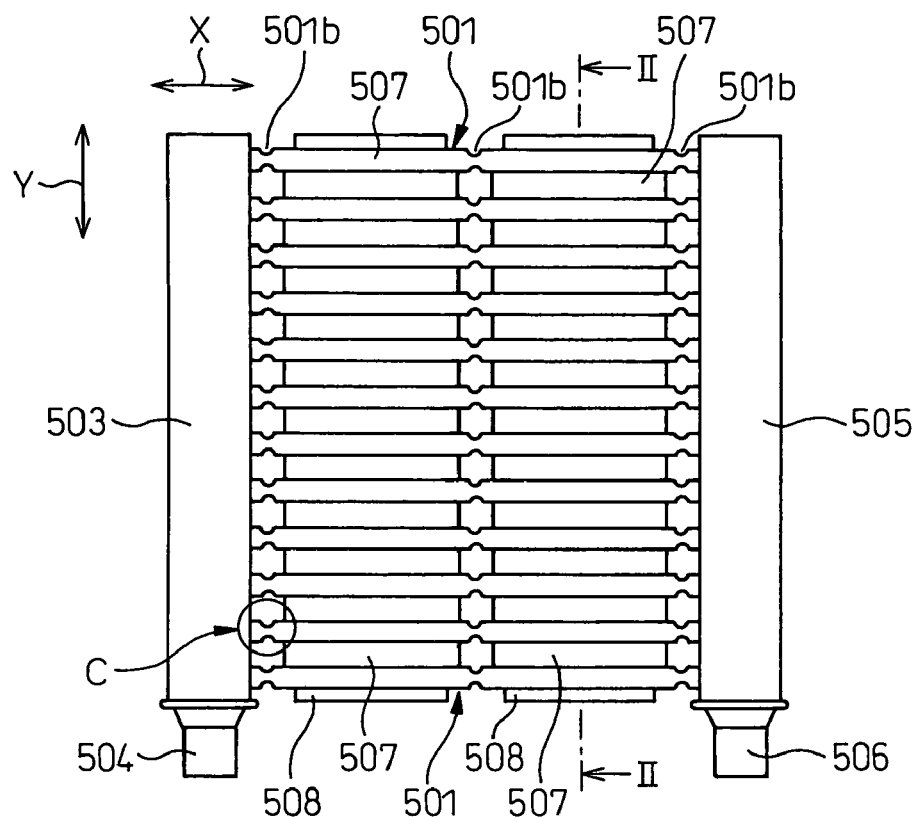
FIG. 16 is a front view of the cooler according to the first embodiment of the present invention.
Figure 17:
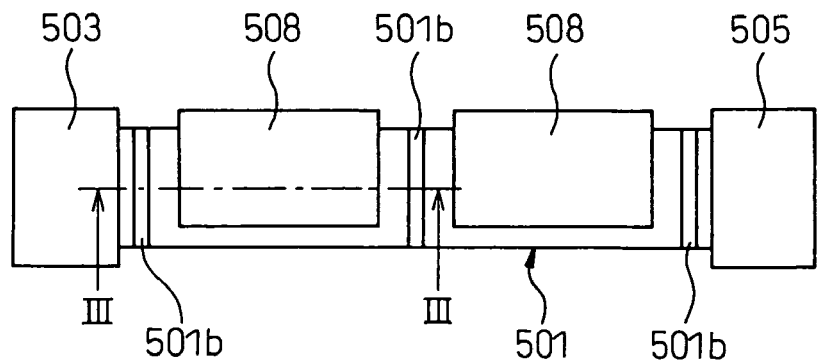
FIG. 17 is a plan view of the cooler in FIG. 16.
Figure 18:
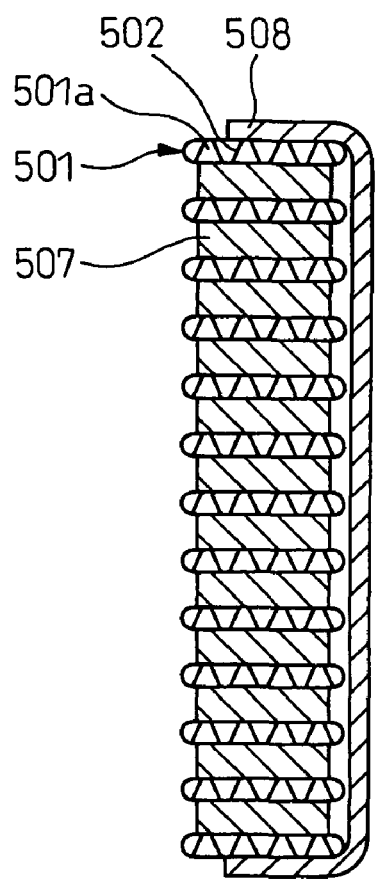
FIG. 18 is a sectional view along the II-II line in FIG. 16.
Figure 19:
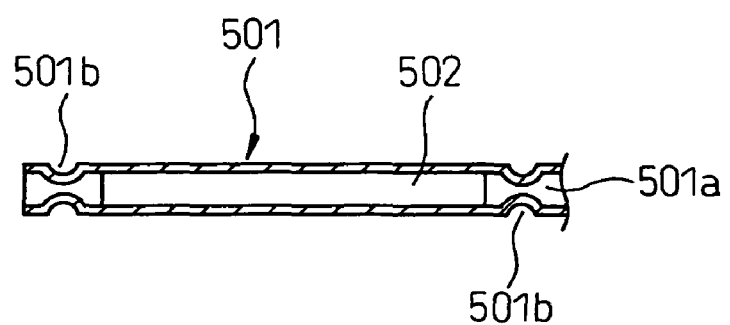
FIG. 19 is a sectional view of a tube along the III-III line in FIG. 17.
Figure 20:
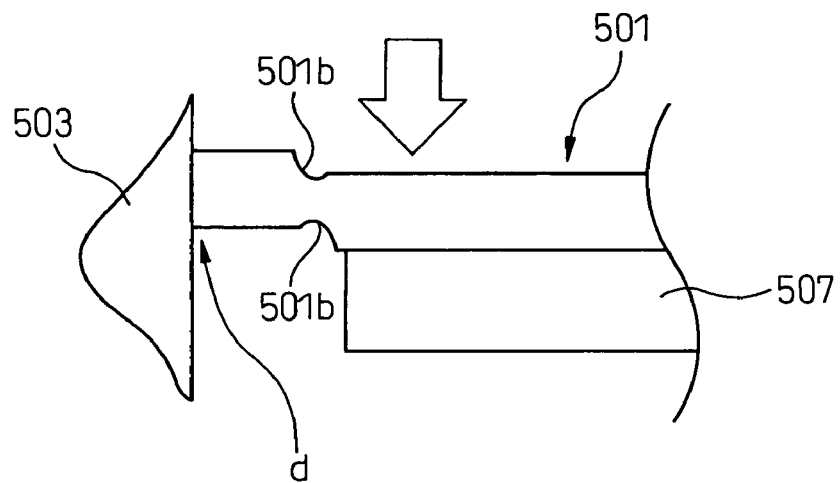
FIG. 20 is an enlarged view of part C in FIG. 16.

A cooler according to a ninth embodiment of the present invention is explained below. FIG. 16 is a front view of the cooler according to the ninth embodiment, FIG. 17 is a top plan view of the cooler in FIG. 16, FIG. 18 is a sectional view along the II-II line in FIG. 16, FIG. 19 is a sectional view of a tube along the III-III line in FIG. 17, and FIG. 20 is an enlarged view of part C in FIG. 16.

As shown in FIG. 16 to FIG. 19, the cooler comprises a plurality of flat tubes 501 having, internally, a fluid passage 501a through which a cooling fluid flows. The plurality of flat tubes 501 are arranged in layers at predetermined intervals in the direction Y (hereinafter, referred to as the direction of built-up Y) perpendicular to the direction X in which the cooling fluid flows within the fluid passage 501a (referred to as the direction of flow X). In the present embodiment, water mixed with an ethylene glycol base antifreeze liquid is used as the cooling fluid.

The flat tube 501 comprises two plates, which are an aluminum thin plate formed into a predetermined shape by press molding. The flat tube 501 is formed by joining by brazing the edges of the two plates in a state in which a fin 502, which is an aluminum thin plate formed into a corrugated shape by press molding, is sandwiched between the two plates.

In the flat tube 501, in total, three narrow parts 501b, which become narrow in the direction of built-up Y, are formed in the vicinity of both ends in the direction of flow X and at the central part, respectively. The narrow parts 501b extend in the direction perpendicular to the direction of built-up Y and the direction of flow X. The narrow parts 501b are located at portions of the flat tube 501 at which are semiconductor modules (to be described in detail later) are not held.

The fins 502 accelerate heat exchange between the cooling fluid and the flat tube 501 and are arranged at positions at which the narrow parts 501b are not formed.

To one end of each flat tube 501, an inlet header tank 503 made of aluminum for distributing the cooling fluid to the flat tubes 501 is joined by brazing, and to one end of the inlet header tank 503, an inlet pipe 504 made of aluminum, through which the cooling fluid flows in, is joined by brazing.

To the other end of each flat tube 501, an outlet header tank 505 made of aluminum for gathering the cooling fluid from the flat tubes 501 is joined by brazing, and to one end of the outlet header tank 505, an outlet pipe 506 made of aluminum, through which the cooling fluid flows out, is joined by brazing.

The inlet pipe 504 and the outlet pipe 506 are connected to a pump (not shown) for circulating the cooling fluid and to a heat exchanger (not shown) for cooling the cooling fluid.

Two semiconductor modules, of a double-sided cooling type 507, which are heat producing bodies, are arranged between neighboring flat tubes 501. In other words, the semiconductor modules 507 are arranged in two or more rows (two rows in the present embodiment) when viewed in the direction of built-up Y. The flat tube 501 and the semiconductor module 507 come into contact with each other directly or via an insulating material (a ceramic plate, in most cases) or thermally conductive grease. The semiconductor module 507 in the present embodiment which incorporates an IGBT element and a diode and corresponds to the electronic part in the present invention.

The semiconductor module 507 is held between the flat tubes 501, to which a pressing force is applied in the direction of built-up Y, by sandwiching and pressing the laminated (piled) flat tubes 501 from both ends in the direction of built-up Y using plate springs 508. The plate spring 508 applies a pressing force to each of a plurality of the rows of the semiconductor modules 507 independently of each other by independently sandwiching and pressing each of the rows in which a plurality of the semiconductor modules 507 are arranged.

As described above, when a pressing force is applied in the direction of built-up Y by the plate spring 508, the flat tube 501 deforms in the direction of built-up Y at the narrow parts 501, as shown in FIG. 20, in accordance with the interval between the flat tubes 501 and the thickness of the semiconductor module 507. Due to this, both the flat tubes 501 and the semiconductor module 507 come into close contact with each other over the entire surfaces thereof in opposition to each other. Moreover, as a pressing force is applied to each of the rows independently of each other, even if neighboring semiconductor modules 507 vary in thickness from each other, the flat tube 501 deforms in the direction of built-up Y at the portion of the central narrow part 501$b$, thereby the variation is absorbed.

In the above-mentioned configuration, the cooling fluid that has flowed in through the inlet pipe 504 flows into one end of the fluid passage 501$a$ of each of the flat tubes 501 through the inlet header tank 503, flows into the outlet header tank 505 through the fluid passage 501$a$, and reaches the outlet pipe 506. Then heat exchange is effected between the cooling fluid flowing through the fluid passage 501$a$ and the semiconductor module 507 and the semiconductor module is thus cooled.

In the present embodiment described above, the flat tube 501 deforms readily in the direction of built-up Y at the narrow parts 501$b$ in accordance with the interval between the flat tubes 501 and the thickness of the semiconductor modules 507. At this time, as the part of the flat tube 501 between the narrow parts 501$b$ does not deform in an arc-shape, the flat tube 501 and the semiconductor module 7 come into close contact with each other at the entire surfaces thereof in opposition to each other and a sufficient contact area can be ensured between the semiconductor module 507 and the flat tube 501.

What is required is only to form the narrow parts 501$b$ in the flat tube 501 and, therefore, the above can be achieved without increasing the number of parts.

Moreover, as the flat tube 501 deforms readily in the direction of built-up Y at the narrow parts 501$b$, stress can be prevented from concentrating on the joined parts d between the flat tube 501 and the header tanks 503 and 505 when the flat tube 501 deforms (refer to FIG. 20) and the stress produced by deformation can be reduced.

When the header tanks 503 and 505 and the flat tube 501 are brazed, the brazing material gathers in the narrow parts 501$b$ and, therefore, it is possible to prevent the brazing material from flowing up to the part at which the flat tube 501 and the semiconductor module 507 come into contact with each other.

As the narrow parts 501$b$ are located at the portions of the flat tubes 501 at which the semiconductor modules 507 are not held, it is possible to prevent the contact area between the semiconductor module 507 and the flat tube 501 from being reduced.

As a pressing force is applied to each of the two rows of the semiconductor modules 507 independently of each other, when viewed in the direction of built-up Y, even if neighboring semiconductor modules 507 vary in thickness from each other, the flat tube 501 deforms in the direction of built-up Y at the center narrow part 501$b$ and, thereby the variation can be absorbed and the contact thermal resistance can be reduced.

As the narrow parts 501$b$ extend perpendicular to both the direction of built-up Y and the direction of flow X, it is possible to easily deform the flat tubes 501 in the direction of built-up Y at the narrow parts 501$b$.

As the fins 502 are arranged at positions in the flat tube 501, at which the narrow parts 501$b$ are not formed, it is possible to utilize the narrow parts 501$b$ to determine the positions of the fins 502 in the manufacturing process.

[Tenth Embodiment]

Figure 21:
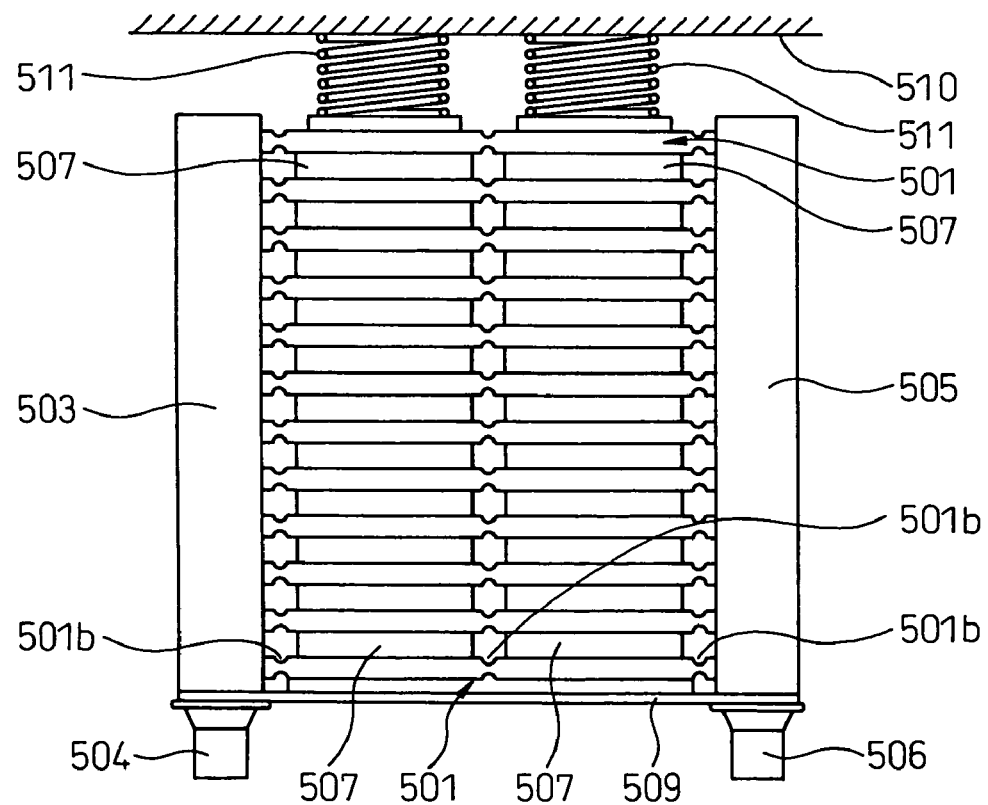
FIG. 21 is a front view of the cooler according to the second embodiment of the present invention.

A cooler according to a tenth embodiment of the present invention is explained below. FIG. 21 is a front view of the cooler according to the tenth embodiment. The same numerals or letters are assigned to the same or equivalent parts as those in the ninth embodiment and no explanation will be given to them here.

In the present embodiment, as shown in FIG. 21, a reinforcement plate 509, the rigidity of which, in the direction of built-up Y, is higher than that of the flat tube 501, is provided. The reinforcement plate 509 is made of aluminum and both ends thereof are joined by brazing to the header tanks 503 and 505 and the intermediate part is in contact with the flat tube 501 at one end in the direction of built-up Y.

After the cooler is mounted on, for example, a vehicle, coil springs 511 are provided between the flat tube 501 at the other end in the direction of built-up Y and a fixed wall 510 of the vehicle. A pressing force is applied in the direction of built-up Y by the coil springs 511 and, thereby, the semiconductor modules 507 are held between the flat tubes 501. At this time, the pressing force of the coil springs 511 is supported by the reinforcement plate 509. The coil spring 511 presses each of the rows of the semiconductor modules 507, which are arranged in two or more rows, independently of each other.

As described above, due to the application of the pressing force in the direction of built-up Y by the coil spring 511, the flat tubes 501 deform in the direction of built-up Y at the narrow parts 501$b$ in accordance with the interval between the flat tubes 501 and the thickness of the semiconductor modules 507 and, thereby the flat tubes 501 and the semiconductor module 507 come into close contact at the entire surfaces thereof in opposition to each other. Moreover, as a pressing force is applied to each of the rows independently of each other, even if neighboring semiconductor modules 507 vary in thickness from each other, the flat tube 501 deforms in the direction of built-up Y at the center narrow part 501b and, thereby the variation is absorbed.

In the present embodiment, as the strength of the cooler can be improved by the reinforcement plate 509, it is possible to prevent the cooler itself from deforming during the transportation of the cooler that does not hold a semiconductor module 507.

Although coil springs 511 are used in the present embodiment, a pressing force may be applied in the direction of built-up Y by plate springs.

[Eleventh Embodiment]

A cooler of built-up type according to an embodiment of the present invention is explained below with reference to FIG. 22 to FIG. 26.

Figure 22:
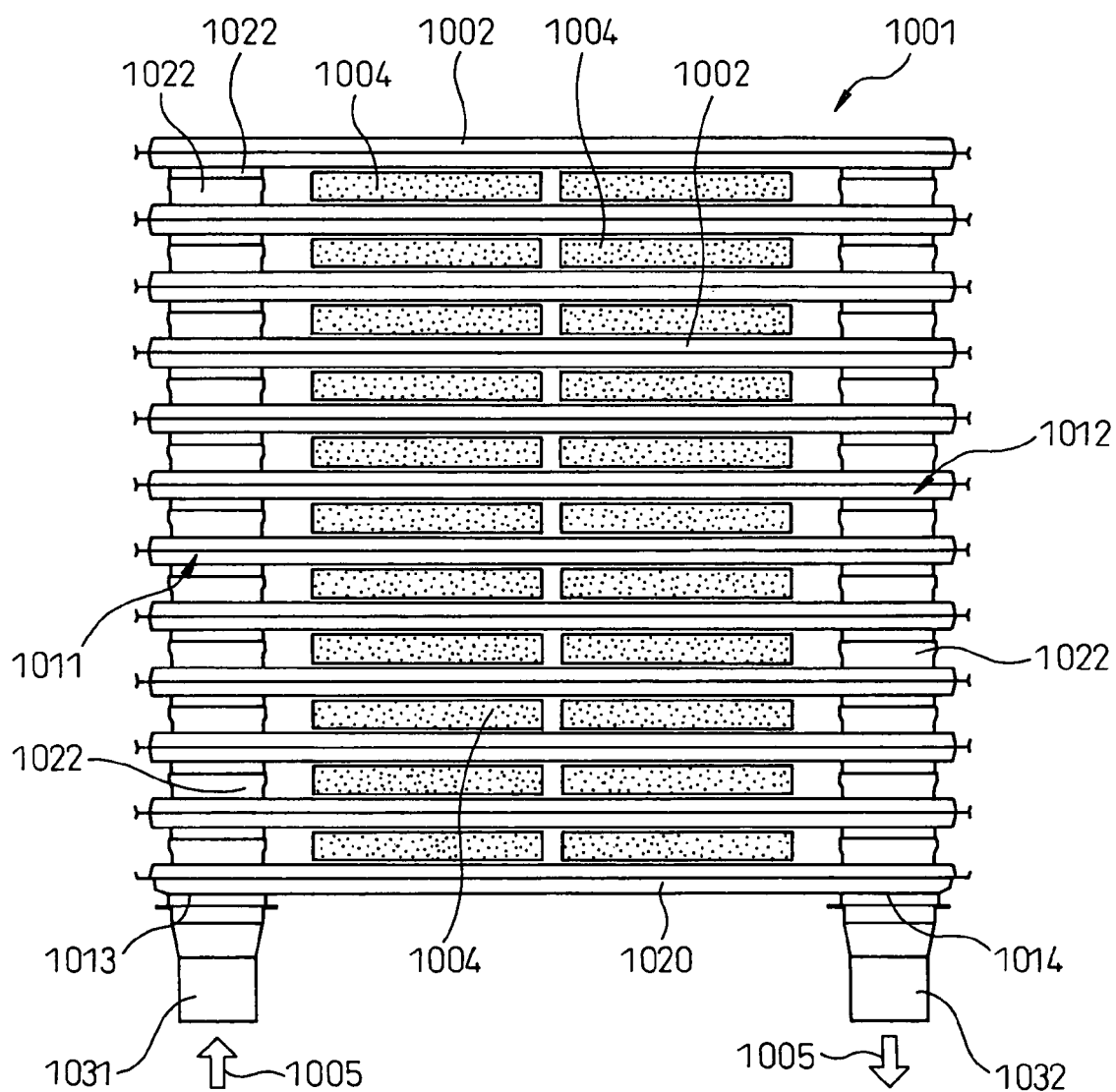
FIG. 22 is a plan view of a cooler of a built-up type in an eleventh embodiment.

As shown in FIG. 22, a cooler of built-up type 1001 according to the present embodiment cools an electronic parts 1004 from both sides thereof, each of which accommodates an power element, etc., for controlling large power and is formed into a plate-like shape. The electronic part 1004 is formed into a flat rectangular solid, in which an electrode for power extends from the outer surface including one long side and another electrode for control extends from the outer surface including the other long side.

A cooling tube 1002 is arranged in contact with one of the main surfaces of the electronic part 1004 and another cooling tube 1002 is arranged in contact with the other main surface of the electronic part 1004. These cooling tubes 1002 are connected to a supply header section 1011 and a discharge header section 1012 provided at both ends of the cooling tubes 1002. In the present embodiment, a plurality of the electronic parts 1004 are cooled from both sides thereof. Because of this, a plurality of the electronic parts 1004 and a plurality of the cooling tubes 1002 are arranged alternately. In an assembled body in which a plurality of the electronic parts 1004 and a plurality of the cooling tubes 1002 are arranged in layers, the cooling tubes 1002 are arranged at both ends of the assembled body in the direction of built-up thereof.

The cooler of a built-up type 1001 comprises a plurality of the cooling tubes 1002, which are each flat and are provided with a refrigerant flow passage 1021 through which a cooling medium 1005 flows, and which are arranged in layers so as to sandwich and hold the electronic parts 1004 from both sides thereof. The cooler of a built-up type 1001 comprises the supply header section 1011 for supplying the cooling medium 1005 to each of the refrigerant flow passages 1021 and the discharge header section 1012 for discharging the cooling medium 1005 from each of the refrigerant flow passages 1021.

Figure 23:
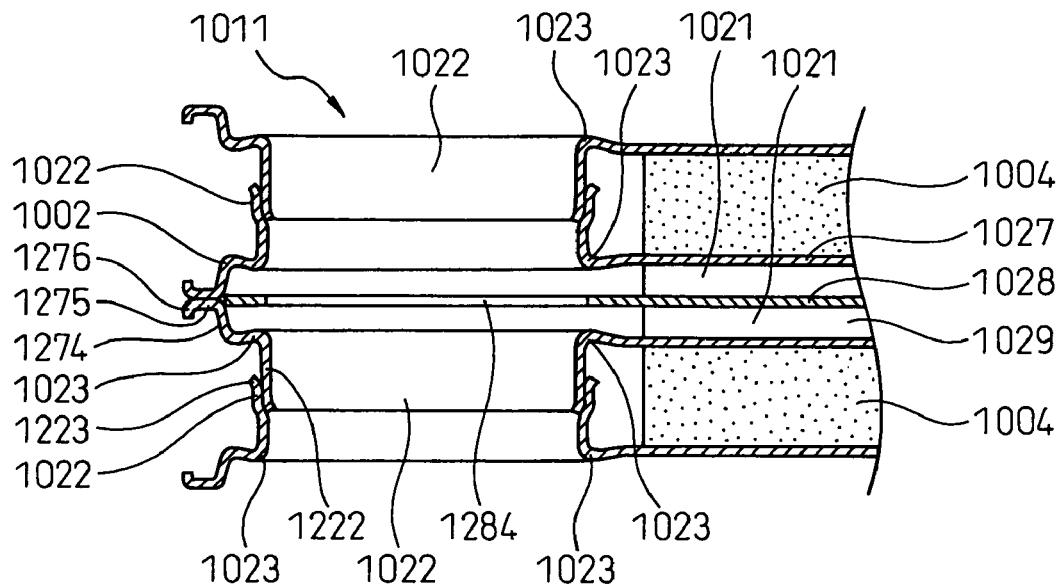
FIG. 23 is a sectional view in the vicinity of a supply header section of the cooler of a built-up type in the eleventh embodiment.
Figure 25:
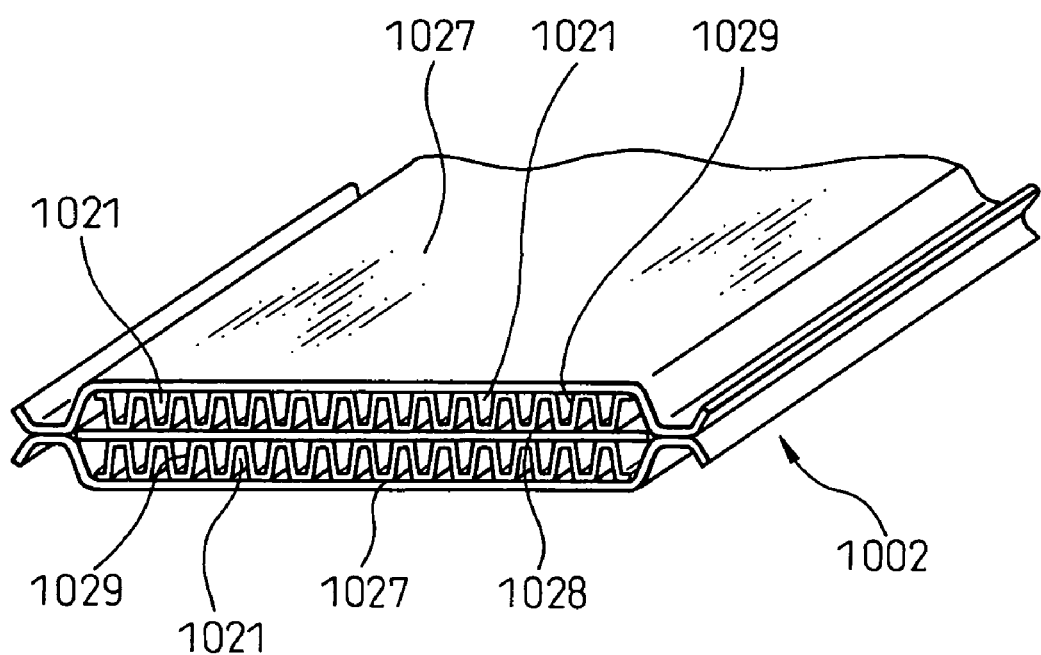
FIG. 25 is a sectional perspective view of a cooling tube in the eleventh embodiment.

As shown in FIG. 22 and FIG. 23, the above-mentioned cooling tube 1002 is provided with protruding pipe parts 1022 that protrude as well as opening toward the direction of built-up. As shown in FIG. 25, the cooling tube 1002 is made up by building plates made of metal having a high thermal conductivity, such as aluminum or copper, and by joining the plates by means of joining techniques such as brazing. The plates have a substantially rectangular shape as a whole. An outer shell plate 1027 that makes up the outer shell of the cooling tube 1002 comprises parts making up a flat pipe that comes into contact with the electronic part 1004 to take heat therefrom and parts making up the supply header section 1011 and the discharge header section 1012. The parts making up the supply header section 1011 and the discharge header section 1012 are formed at both ends of the outer shell plate 1027.

The parts making up the supply header section 1011 and the discharge header section 1012 of the outer shell plate 1027 are characterized by the protruding pipe parts 1022 protruding in the vertical direction from the plate-shaped surface of the outer shell plate 1027 and diaphragm parts 1023 formed into an annular shape on the periphery of the root parts of the protruding pipe parts 1022 and having a predetermined width in the radial direction. The respective protruding pipe parts 1022 couple neighboring cooling tubes 1002 in the direction of built-up, make up the supply header section 1011 and the discharge header section 1012, and provide a strength that can prevent buckling in the direction of built-up.

The cooling tube 1002 can comprise the flat pipe part, the diaphragm parts 1023, and the protruding pipe parts 1022 extending in the direction of built-up. The protruding pipe part 1022 may comprise a pipe-shaped member separately provided.

The protruding pipe parts 1022 are connected using counter-lock joints (like female and male joints). In other words, the protruding pipe part 1022 has a stepped protruding pipe part having a large diameter 1223 arranged outside and a protruding pipe part having a small diameter 1222 inserted into the inside of the protruding pipe part having a large diameter 1223. Because of this, the cooler of a built-up type 1001 comprises at least two kinds of outer shell plates 1027. One of the two kinds of outer shell plates 1027 has the protruding pipe part having a large diameter 1223 and the other kind of outer shell plates 1027 has the protruding pipe part having a small diameter 1222. These two kinds of outer shell plates 1027 are laminated (piled) alternately in such a manner that the topsurface of one (first) kind of the outer shell plates faces the undersurface of the other kind, the topsurface of which in turn faces the undersurface of the first kind, and so on.

Figure 26:
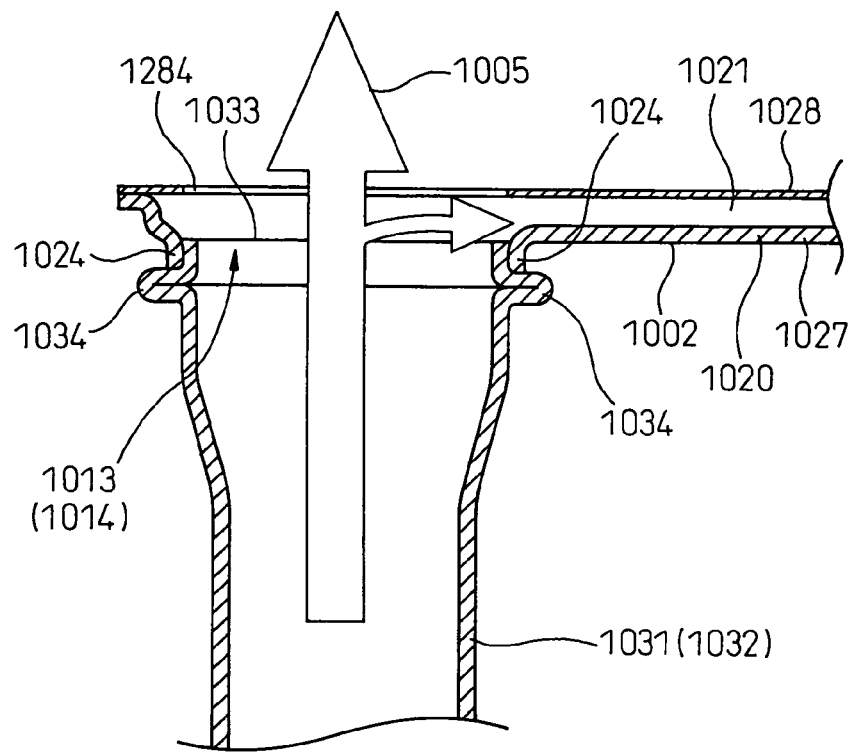
FIG. 26 is a sectional view of a connection part of a refrigerant introduction pipe (or a refrigerant discharge pipe) and a refrigerant introduction inlet (or a refrigerant discharge outlet) in the eleventh embodiment.

The cooler of a built-up type 1001 further comprises the outer shell plates 1027 for end use at both ends thereof. In other words, one of the outer shell plates 1027 for end use neither forms the protruding pipe part 1022 nor opens. The other outer shell plate 1027 for end use is the outer shell plate 1027 to be used for a cooling pipe 1020, which will be described later, and forms a protruding opening parts 1024 for connecting a refrigerant introduction pipe 1031 and a refrigerant discharge pipe 1032 instead of the protruding pipe parts 1022, as shown in FIG. 26.

The protruding pipe part having a large diameter 1223 accommodates the protruding pipe part having a small diameter 1222 therein. The stepped part formed in the protruding pipe part having a large diameter 1223 functions as a control part for controlling the insertion length of the protruding pipe part having a small diameter 1222. The front end of the protruding pipe part having a small diameter 1222 comes into contact with the stepped part and thus the insertion length in the axial direction is controlled. The controlled part can be composed of a swelling part or a bulged part formed on the outer surface of the protruding pipe part with small diameter 1222 in a protruding manner. There exists an interval between the inner surface of the protruding pipe part having a large diameter 1223 and the outer surface of the protruding pipe part having a small diameter 1222, which may allow an insertion in the assembling process thereof, but the interval is closed and sealed by joining both protruding pipe parts by brazing.

After being joined, the protruding pipe parts 1022 provide rigidity that can prevent buckling even if a pressure in the axial direction, namely in the direction of built-up, which can plastically deform the diaphragm part 1023, is applied thereto.

Figure 24:
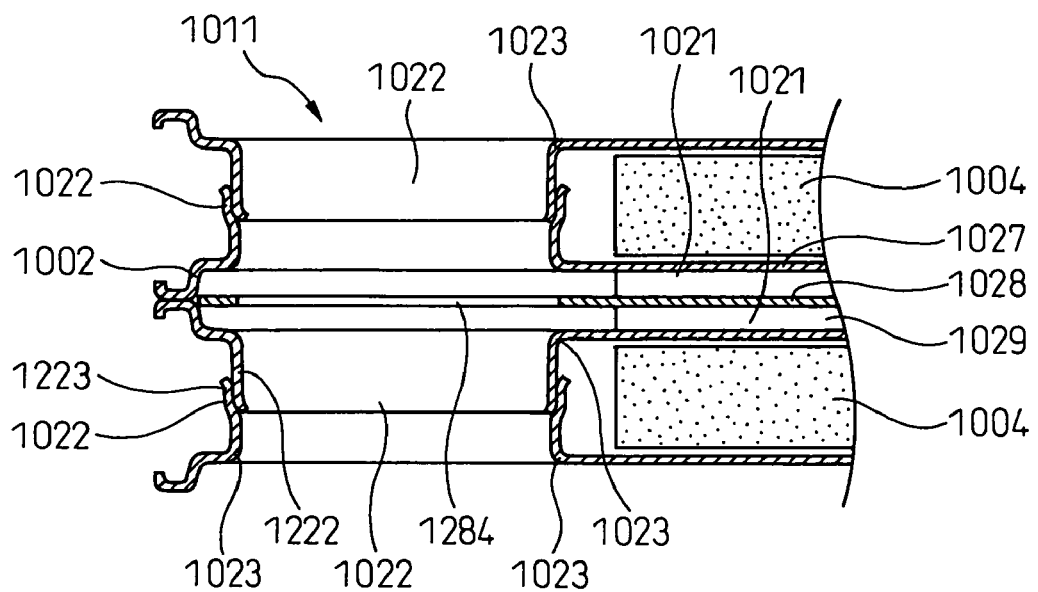
FIG. 24 is a sectional view in the vicinity of the supply header section in the eleventh embodiment before a diaphragm part is deformed.

On each of the outer edge parts of the outer shell plate 1027, an outer wall surface 1274 that is erected in the direction of built-up, a flange part 1275 having a narrow width and extending from the outer wall surface 1274 toward the outside, and an edge part 1276 further extending obliquely from the front end of the flange part 1275 are formed, as shown in FIG. 23 and FIG. 24. The flange part 1275 provides a plane extending in the direction perpendicular to the direction of built-up.

A pair of the outer shell plates 1027 is joined by brazing in a state in which the flange parts 1275 thereof are arranged so as to be parallel to and in contact with each other. Therefore, the outer shell plates 1027 are piled and joined at the outer edge part thereof by the flange part 1275 via a plane perpendicular to the direction of built-up in between. On the other hand, the outer shell plates 1027 are piled and joined at the parts making up the supply header section 1011 and the discharge header section 1012 by connecting the protruding pipe parts 1022 using counter-lock joints via a cylindrical plane in parallel to the direction of built-up in between. It may be possible to adopt a configuration in which flange parts are provided at the front ends of the protruding pipe parts 1022 extending in the directions in opposition to each other and the outer shell plates are piled and joined via a plane perpendicular to the direction of built-up in between.

The configuration in which the protruding pipe parts 1022 are connected using counter-lock joints has advantages that the degree of freedom in adjusting the length in the axial direction is higher compared to the structure in which built-up is conducted via a plane perpendicular to the direction of built-up in between, that the manufacture of the outer shell plate 1027 in the forming process is easy, and that the cost is low.

As described above, neighboring cooling tubes 1002 make the refrigerant flow passages 1021 thereof communicate with each other by joining the sidewalls of the protruding pipe parts 1022 as well as inserting the protruding pipe parts 1022 into each other. Due to this, the supply header section 1011 and the discharge header section 1012 are formed.

Moreover, as shown in FIG. 23, the cooling tube 1002 comprises the diaphragm parts 1023 that deform in the direction of built-up and which are formed around the protruding pipe parts 1022. The diaphragm part 1023 deforms toward the inside of the cooling tube 1002 when the electronic part 1004 is arranged in the cooler of a built-up type 1001 and the interval between neighboring cooling tubes 1002 is narrowed.

In other words, before sandwiching and holding the electronic parts 1004, the cooler of a built-up type 1001 laminates a plurality of the cooling tubes 1002 at intervals somewhat wider than the thickness of the electronic parts 1004 and connects the cooling tubes 1002 at the protruding pipe parts 1022 thereof, as shown in FIG. 24. A plurality of the electronic parts 1004 are arranged between the cooling tubes 1002 of the cooler of a built-up type 1001 in such a state. After this, the cooler of a built-up type 1001 is compressed in the direction of built-up. Due to this, a pressing force is applied to the diaphragm parts 1023 via the protruding pipe parts 1022 and the diaphragm parts 1023 deform toward the inside of the cooling tube 1002, as shown in FIG. 23. As a result, the interval between neighboring cooling tubes 1002 is narrowed, the cooling tubes 1002 and the electronic part 1004 come into close contact with each other, and the electronic part 4001 is sandwiched and held by the cooling tubes 1002.

Moreover, the cooling tube 1002 comprises a pair of the outer shell plates 1027, an intermediate plate 1028 arranged between the pair of the outer shell plates 1027, and a corrugated inner fins 1029 arranged between the intermediate plate 1028 and the outer shell plates 1027, as shown in FIG. 25.

The refrigerant flow passages 1021 are formed between the intermediate plate 28 and the outer shell plates 27.

Moreover, the outer shell plates 1027, the intermediate plate 1028, and the inner fins 1029 are joined to one another by brazing to make up the cooling tube 1002.

The intermediate plate 1028 is a rectangular plate-like shape. The intermediate plate 1028 has circular opening parts 1284 at both ends thereof corresponding to the supply header section 1011 and the discharge header section 1012. The outer edge part of the intermediate plate 1028 may be sandwiched and held between the outer shell plates 1027.

As shown in FIG. 22, a first cooling tube 1020 among a plurality of the cooling tubes 1002, which is arranged at one end in the direction of built-up, comprises a refrigerant introduction inlet 1013 for introducing the cooling medium 1005 to the supply header section 1011 and a refrigerant discharge outlet 1014 for discharging the cooling medium 1005 from the discharge header section 1012. The refrigerant introduction inlet 1013 and the refrigerant discharge outlet 1014 comprise the respective protruding opening parts 1024 protruding toward the outside of the first cooling tube 1020, as shown in FIG. 26. Then, the respective refrigerant introduction pipe 1031 and the refrigerant discharge pipe 1032 are inserted into the respective protruding opening parts 1024 of the refrigerant introduction inlet 1013 and the refrigerant discharge outlet 1014.

The protruding opening part 1024 protrudes about 2 mm from the main surface of the first cooling tube 1020 as well as rising substantially vertically on the main surface thereof by means of a burring process.

Moreover, the refrigerant introduction pipe 1031 and the refrigerant discharge pipe 1032 are each provided with a flange part 1034 at a part about 2 mm apart away from the end surface of each of opening front end parts 1033.

The respective opening front end parts 1033 of the refrigerant introduction pipe 1031 and the refrigerant discharge pipe 1032 are inserted into the insides of the respective protruding opening parts 1024 and, at the same time, the flange parts 1034 come into contact with the front ends of the protruding opening parts 1024. Due to this, each of the opening front end parts 1033 of the refrigerant introduction pipe 1031 and the refrigerant discharge pipe 1032 is unlikely to be inserted as far as the inside of the outer shell plate 1027 in the cooling tube 1002 and, therefore, the refrigerant flow passage 1021 is unlikely to be cut off.

The above-mentioned electronic part 1004 is a semiconductor module that incorporates semiconductor elements such as an IGBT and diodes. The semiconductor module makes up a part of an inverter for a vehicle.

As the cooling medium 1005, water mixed with an ethylene glycol base antifreeze liquid is used.

Moreover, the electronic part 1004 can be arranged in a state in which the electronic part is in direct contact with the cooling tube 1002. However, it is possible, as the case may be, to interpose an insulating plate such as ceramic, thermally conductive grease, etc. between the electronic part 1004 and the cooling tube 1002.

Next, the functions and effects of the present embodiment are explained below.

In the above-mentioned cooler of a built-up type 1, as shown in FIG. 22 and FIG. 23, the respective refrigerant flow passages 1021 of neighboring cooling tubes are communicated with each other by inserting the protruding pipe parts 1022 formed on the cooling tubes 1002, with each other. Because of this, it is not necessary for a plurality of the cooling tubes 1002 to be connected specifically via members separately provided and, therefore, the number of parts can be reduced and the manufacture of the cooler is easy.

Moreover, as shown in FIG. 23, the protruding pipe parts 1022 of neighboring cooling tubes 1002 are connected by joining the sidewalls of the protruding pipe parts 1022 to each other. Therefore, it is possible for the supply header section 1011 and the discharge header section 1012 to ensure a flow passage diameter substantially the same as the inner diameter of the protruding pipe part 1022. Due to this, it is possible to not only reduce the flow resistance in the supply header section 1011 and the discharge header section 1012 but also to prevent pressure loss. Because of this, the cooling medium 1005 can be supplied evenly into a plurality of the cooling tubes 1002 and, moreover, a plurality of the electronic parts 1004 can be cooled evenly.

As shown in FIG. 23, the cooling tube 1002 comprises the diaphragm parts 1023 formed around the protruding pipe parts 1022. Due to this, it is possible to easily adjust the interval between neighboring cooling tubes 1002 and to easily and firmly arrange the electronic parts 1004 between neighboring cooling tubes 1002. As a result, the electronic part 1004 can be made to come into close contact with the cooling tubes 1002.

The cooling tube 1002 comprises a pair of the outer shell plates 1027, the intermediate plate 1028, and the inner fins 1029. Because of this, it is possible to obtain the cooling tube 1002 having a so-called drawn-cup structure by joining together the outer shell plates 1027, the intermediate plate 1028, and the inner fins 29 after separate manufacture thereof by press molding, etc. Therefore, the cooling tube 1002 can be manufactured easily.

Moreover, it becomes easy to form the inner fins 1029 at desired positions (areas). Because of this, the forming of the supply header section 1011 and the discharge header section 1012 can be made easy by not arranging the inner fins 1029 at areas at which the supply header section 1011 and the discharge header section 1012 are formed.

In this case, as shown in FIG. 25, the refrigerant flow passages 1021 are formed in two rows in the direction of built-up of the cooling tubes 1002, as a result. Because of this, it is possible to prevent the transfer of heat between the electronic parts 1004 arranged at both ends of the cooling tube 1002. Therefore, it is possible, for example, to prevent the rapid rise in temperature of one of the electronic parts 1004 from affecting another electronic part 1004.

The refrigerant introduction inlet 1013 and the refrigerant discharge outlet 1014 of the first cooling tube 1020 are each provided with the protruding opening part 1024, as shown in FIG. 26. Because of this, it is possible to prevent the refrigerant introduction pipe 1031 and the refrigerant discharge pipe 1032 from cutting off the flow passage between the supply header section 1011 or the discharge header section 1012 and the refrigerant flow passage 1021. Therefore, it is also possible for the first cooling tube 1020 to ensure a flow passage sectional area similar to that of the other cooling tubes 1002 and, as a result, the electronic parts 1004 can be cooled evenly.

As described above, according to the present embodiment, it is possible to provide a cooler of a built-up type capable of not only reducing the manufacturing cost but also making a cooling medium flow evenly to a plurality of cooling tubes.

[Twelfth Embodiment]

Figure 27:
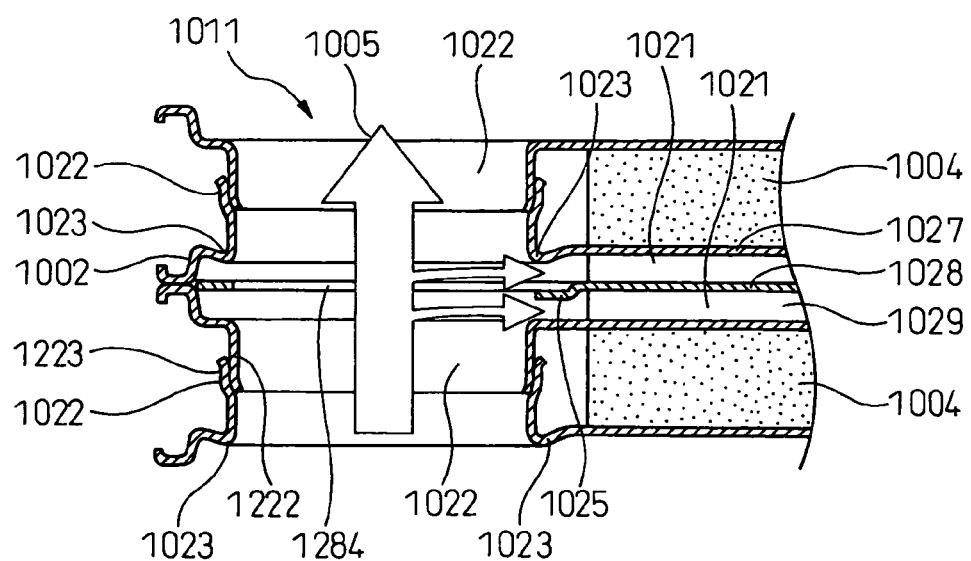
FIG. 27 is a sectional view in the vicinity of a supply header section of a cooler of a built-up type in a twelfth embodiment.
Figure 28:
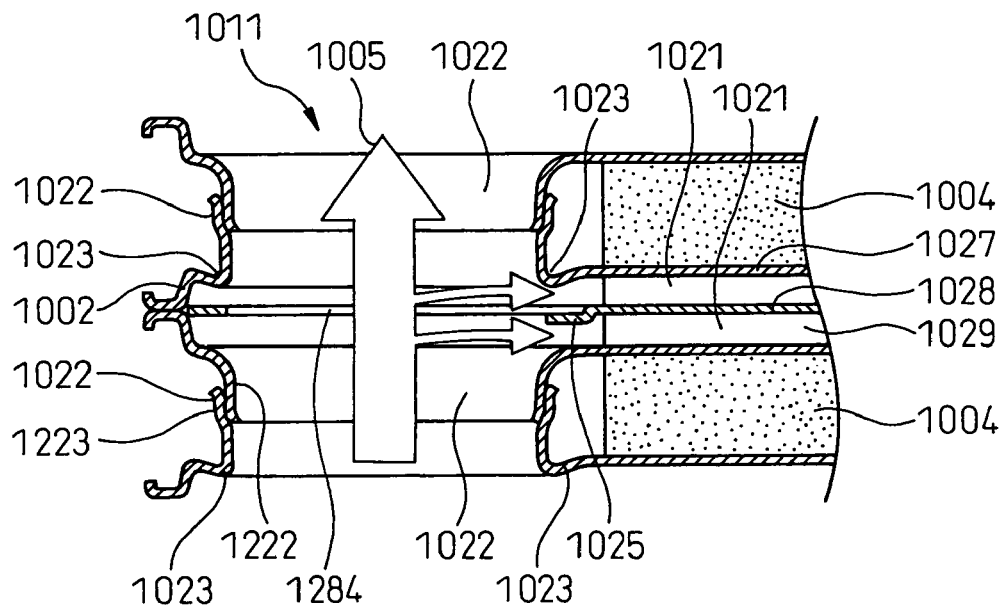
FIG. 28 is a sectional view in the vicinity of the supply header section in the twelfth embodiment when the radius of curvature at the rise part of a protruding pipe part is increased.
Figure 29:
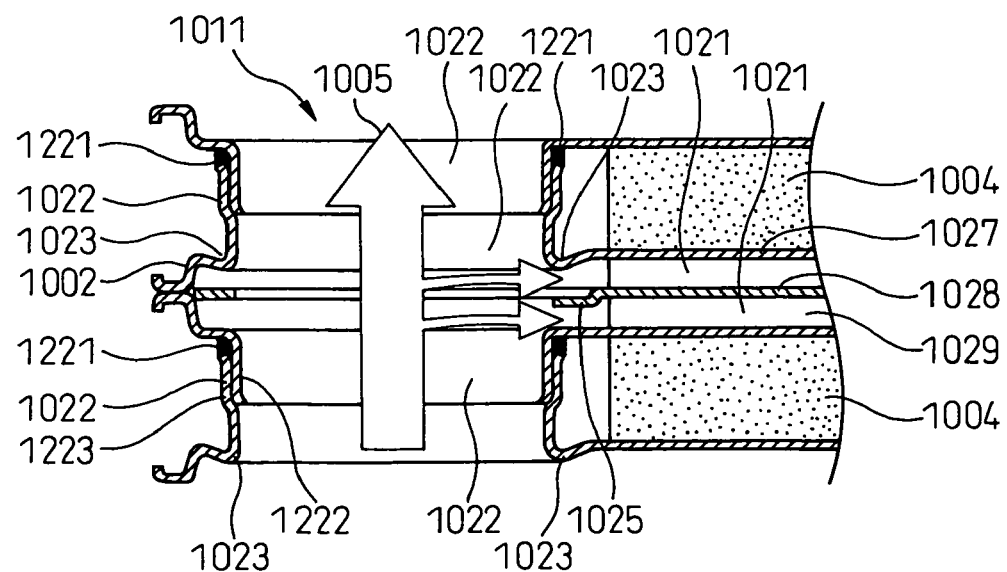
FIG. 29 is a sectional view in the vicinity of the supply header section in the twelfth embodiment when the rise part of the protruding pipe part is reinforced with a fillet made of a brazing material.

A twelfth embodiment is an embodiment, as shown in FIG. 27 to FIG. 29, in which a cooling tube 1002 comprises a diaphragm part 1023 formed around one of a pair of protruding pipe parts 1022 arranged in opposition to each other, and does not comprise a diaphragm part 1023 around the other protruding pipe part 1022.

The cooling tube 1002 comprises the diaphragm part 1023 formed around one of a pair of the protruding pipe parts 1022 which is provided on the downstream side of the supply header section 1011.

Moreover, a flow rectifying part 1025 is provided at the inlet part of the cooling tube 1002 which is a part of the intermediate plate 1028 deformed so as to be involved in the upstream side of the supply header section 1011. The flow rectifying part 1025 controls the flow passage sectional area at the inlet part of one of the two rows of refrigerant flow passages 1021 sandwiching the intermediate plate 1028 to be equal to that of the other refrigerant flow passage 1021.

The flow rectifying part 1025 is formed at the edge of the opening part 1284 of the intermediate plate 1028. The flow rectifying part 1025 adjusts the flow rate of the refrigerant fluid to be distributed to the upper and lower flow passages defined by the intermediate plate 1028. It is possible to adjust the flow rate of the refrigerant fluid to be distributed evenly or unevenly by the shape of the flow rectifying part 1025 in accordance with, for example, the need to cool the electronic parts 1004, which are objects to be cooled. The flow rectifying part 1025 is formed by deforming the edge part of the opening part of the intermediate plate 1028 by a predetermined deformation amount in the same direction as that in which the diaphragm part 1023, provided to only one of the cooling tubes 1002, deforms.

As described above, methods for forming the diaphragm part 1023 around only one of the protruding pipes 1022, namely methods for deforming only one part includes, for example, a method in which the other protruding pipe part 1022 is prevented from being deformed by a pressing force in the direction of built-up by reinforcing the rising part of the other protruding pipe part 1022, as shown in FIG. 28 and FIG. 29. In other words, the method shown in FIG. 28 is a method in which the radius of curvature of the outer shell plate 1027 is increased at the rising part of the other protruding pipe part 1022. The method shown in FIG. 29 is a method in which a fillet 1221 made of a brazing material, which is formed by joining the protruding pipe parts 1022 of neighboring cooling tubes 1002 by brazing, is made to overlap the rise part of the other protruding pipe part 1022.

Others are the same as those in the eleventh embodiment.

In the case of the present embodiment, it becomes easy to manufacture the cooler of a built-up type 1 so as to have a constant shape in a state in which the electronic part 1004 is sandwiched and held therebetween.

In other words, if the diaphragm parts 1023 are provided around both the protruding pipe parts 1022 and deformed as in the eleventh embodiment (refer to FIG. 23), the two protruding pipe parts may vary in the amount of deformation from each other. Then, in this case, if an attempt is made to adjust the amount of deformation of the diaphragm parts 1023, it becomes necessary to accurately control various conditions such as the throttle (reducing area) rate during press molding and the plate thickness of the cooling tube 1002.

Therefore, as described above, by providing the diaphragm part 1023 to only one of the protruding pipe parts 1022, it becomes easy to perform a specific deformation, when the electronic part 1004 is sandwiched and held by the cooling tubes 1002, substantially in accordance with the design.

Moreover, the cooling tube 1002 comprises the diaphragm part 1023 formed around the protruding pipe part 1022 formed on the downstream side of the supply header section 1011, which is one of a pair of the protruding pipe parts 1022. Because of this, it is possible to prevent the smooth supply of the cooling medium 1005 from the supply header section 1011 to the cooling pipe 1002 from being blocked by the diaphragm part 1023.

Figure 30:
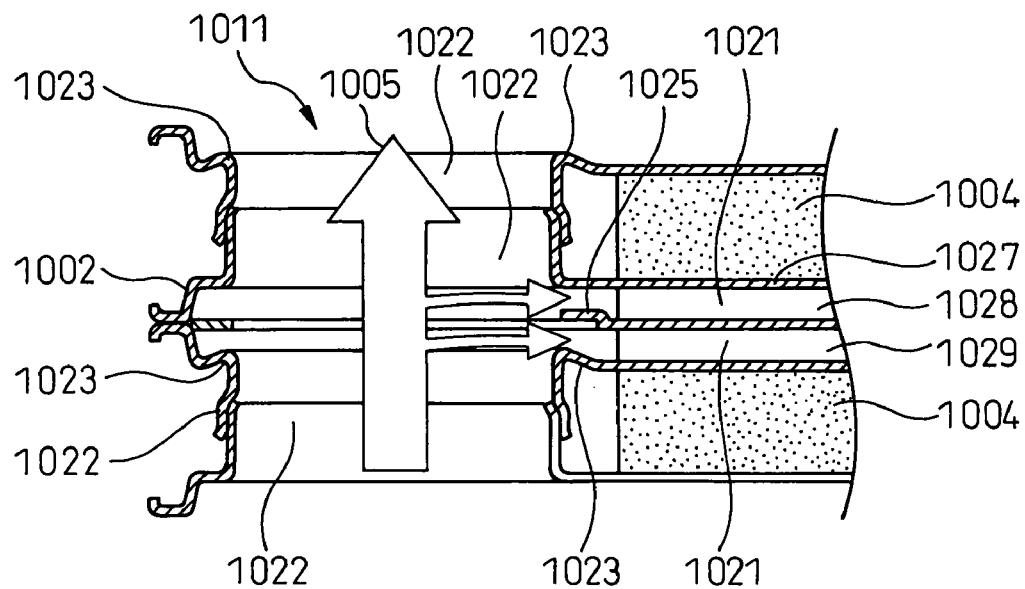
FIG. 30 is a sectional view in the vicinity of a supply header section of a cooler of a built-up type in a comparative example.

In other words, if, as shown in FIG. 30, the diaphragm part 1023 is provided around only one of a pair of the protruding pipe parts 1022 which is formed on the upstream side of the supply header section 1011, the smooth supply of the cooling medium 1005 from the supply header section 1011 to the cooling tube 1002 may be blocked. In other words, when the cooling medium 1005 is supplied from the supply header part 1011 to the cooling tube 1002, the flow of the cooling medium 1005 may separate in the vicinity of the diaphragm part 1023.

Other parts have the same functions and effects as those in the eleventh embodiment.

[Thirteenth Embodiment]

Figure 31:
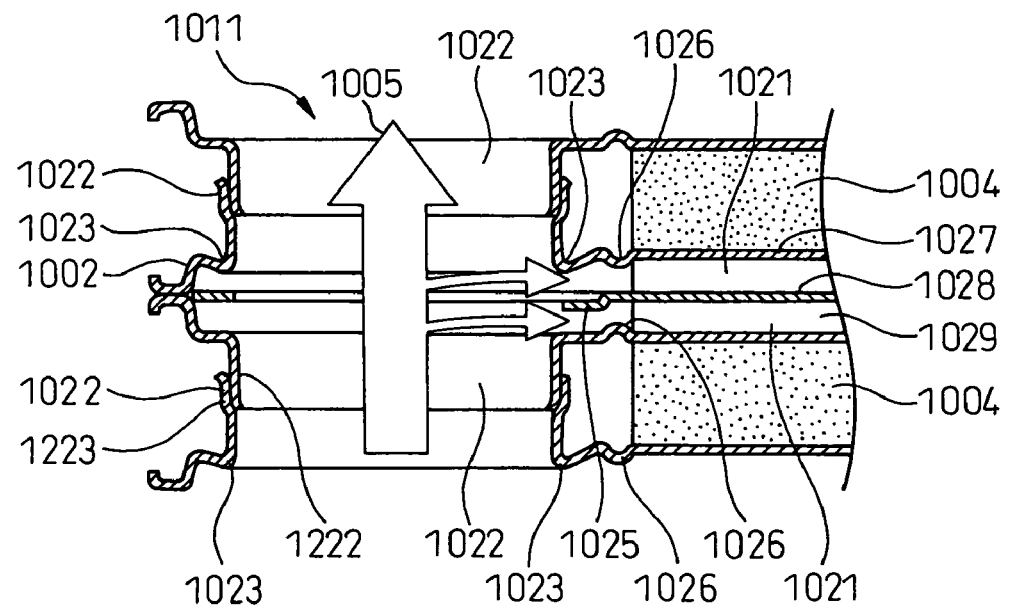
FIG. 31 is a sectional view in the vicinity of a supply header section of a cooler of a built-up type in a thirteenth embodiment.

A thirteenth embodiment is an embodiment, as shown in FIG. 31, in which the cooling tube 1002 comprises a throttle (reducing area) part 1026 for narrowing the width of the refrigerant flow passage 1021 at the inlet part of the refrigerant flow passage 1021.

The cooling tube 1002 is provided with the diaphragm part 1023 and the flow rectifying part 1025 as in the twelfth embodiment.

The throttle part 1026 is formed simultaneously when the outer shell plate 1027 is formed by press molding.

The throttle part 1026 extends continuously across a part of the outer shell plate 1027 in the direction of width of the outer shell plate, which makes up the flat part of the cooling tube 1002. The throttle part 1026 is formed on the outer shell plate 1027 into a groove-like shape when viewed from the outside thereof. The throttle part 1026 reduces the height of the refrigerant flow passage 1021 in the direction of built-up. The throttle part 1026 can be formed as a recess part arranged discretely.

The throttle part 1026 is arranged on the downstream side of the diaphragm part 1023. To be more exact, the throttle part 1026 is arranged between a portion of the cooling tube 1002, which comes into contact with the electronic part 1004, and the diaphragm part 1023. In other words, the throttle part 1026 is arranged on the upstream side of the portion of the cooling tube 1002, which comes into contact with the electronic part 1004.

The throttle part 1026 can also be arranged on the downstream side of the portion of the cooling tube 1002, which comes into contact with the electronic part 1004. Further, the throttle part 1026 can also be arranged on both the upstream side and the downstream side of the portion of the cooling tube 1002, which comes into contact with the electronic part 1004.

The throttle part 1026 has greater rigidity than that of the diaphragm part 1023. The diaphragm part 1023 can be regarded as a part having relatively small rigidity, which readily deforms plastically in the direction of built-up.

The shape of the throttle part 1026 is specified so that the flow passage sectional area of the refrigerant flow passage 1021 at the throttle part 1026 is a minimum. Then, all of the cooling tubes 1002 are made to have the same minimum flow passage sectional area.

Other features are the same as those in the eleventh embodiment.

In the case of the present embodiment, even if the communication area between the header section and the refrigerant flow passage changes because of the deformation of the diaphragm part 1023, the flow rate in the refrigerant flow passage can be adjusted to a desired value by means of the throttle part 1026. This configuration exhibits an advantageous effect when the amount of deformation varies among a plurality of the diaphragm parts 1023. In other words, even if the amount of deformation varies among the diaphragm parts 1023, it becomes easy to make the minimum flow passage sectional area uniform in a plurality of the refrigerant flow passages 1021 and, therefore, the flow rate of the cooling medium 1005 to the respective refrigerant flow passages 1021 can be made uniform.

Other parts have the same functions and effects as those in the eleventh embodiment.

[Fourteenth Embodiment]

Figure 32:
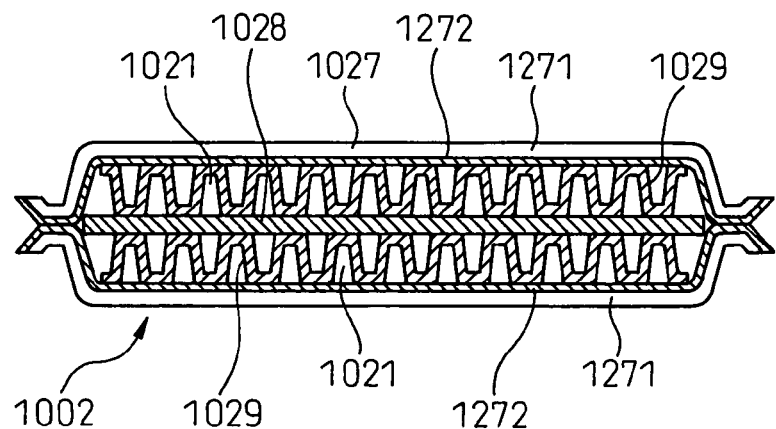
FIG. 32 is a sectional view of a cooling tube, which is perpendicular to a refrigerant flow passage in a fourteenth embodiment.
Figure 33:
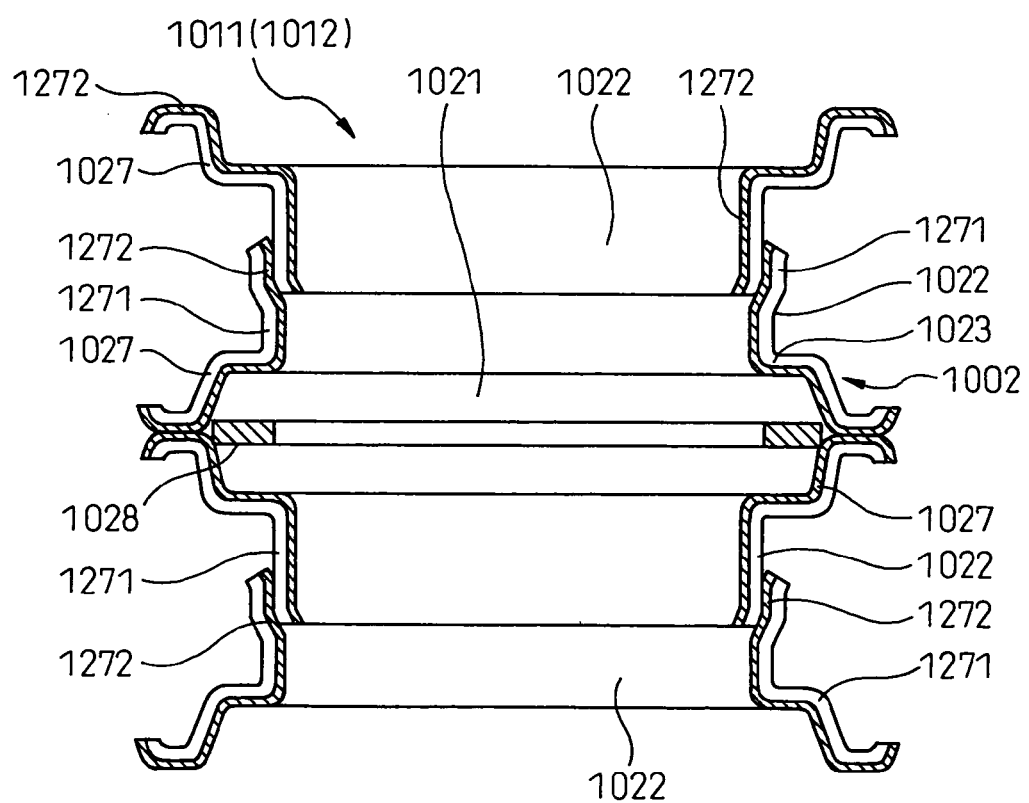
FIG. 33 is a sectional view of a supply header section (a discharge header section) in the fourteenth embodiment.

A fourteenth embodiment is an embodiment, as shown in FIG. 32 and FIG. 33, in which metal plates are used as an outer shell plate 1027, an intermediate plate 1028, and an inner fin 1029 all making up the cooling tube 1002.

In other words, the outer shell plate 1027 is made of a brazing sheet having a core material 1271 and a brazing material 1272 arranged on the inner surface of the core material 1271.

The intermediate plate 1028 and the inner fin 1029 are composed of metal plates including a metal baser (that is, the corrosion potential is lower) than the core material 1271 of the outer shell plate 1027.

A pair of the outer shell plates 1027 join the inner surfaces, at end parts thereof, to each other.

In the case of the present embodiment, as shown in FIG. 33, the protruding pipe part 1022 is provided with the brazing material 1272 arranged on the inner surface thereof. Then, when the protruding pipe parts 1022 of neighboring cooling tubes 1002 are inserted into each other, the brazing material 1272 arranged on the inner surface of one of the protruding pipe parts 1022 comes into contact with the outer surface of the core material 1271 of the other protruding pipe part 1022. Therefore, by heating the contact part in this state, the protruding pipe parts 1022 are joined to each other by the brazing material 1272.

Aluminum (Al) can be used as the core material 1271 and the brazing material 1272 of the outer shell plate 1027 and a metallic material, which is aluminum to which zinc (Zn) has been added, can be used as the intermediate plate 1028, the inner fin 1029, etc.

Others are the same as those in the eleventh embodiment.

FIG. 33 shows a state of the diaphragm part 1023 before deformed. This is applicable to FIG. 35 to FIG. 37, which will be described later.

In the case of the present embodiment, by making the inner fin 1029 and the intermediate plate 1028 corrode before the outer shell plate 1027, the outer shell plate 1027 can be prevented from corroding. Because of this, the cooling medium 1005 can be prevented from leaking from the cooling tube 1002.

As the brazing material 1272 is arranged on the surfaces, to be joined, of a pair of the outer shell plates 1027, it is possible to easily join a pair of outer shell plates 1027 to each other by brazing and to easily manufacture the cooling tube 1002.

As shown in FIG. 33, the brazing material 1272 is arranged on the inner surface of the protruding pipe part 1022 and, therefore, when the protruding pipe parts 1022 of neighboring cooling tubes 1002 are inserted into each other, the brazing material 1272 arranged on the inner surface of one of the protruding pipe parts 1022 comes into contact with the outer surface of the core material 1271 of the other protruding pipe part 1022. Because of this, it is possible to easily join the protruding pipe parts 1022 to each other using the brazing material 1272.

Other parts have the same functions and effects as those in the eleventh embodiment.

[Fifteenth Embodiment]

Figure 34:
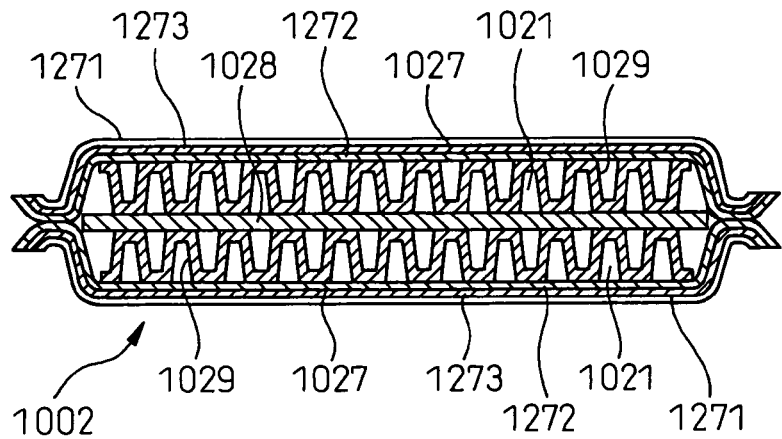
FIG. 34 is a sectional view of a cooling tube, which is perpendicular to a refrigerant flow passage in a fifteenth embodiment.
Figure 35:
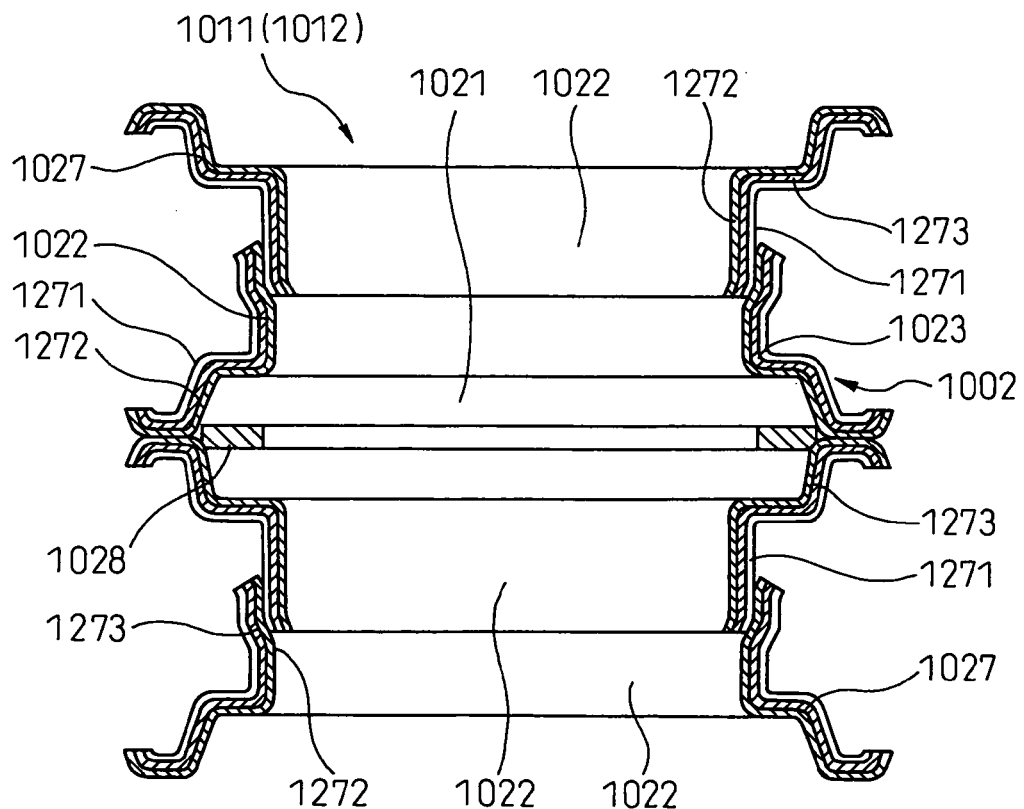
FIG. 35 is a sectional view of a supply header section (or a discharge header section) in the fifteenth embodiment.

A fifteenth embodiment is an embodiment, as shown in FIG. 34 and FIG. 35, in which as the outer shell plate 1027, a brazing sheet is used, having a core material 1271, a sacrifice anode material 1273 arranged on the inner surface of the core material 1271, and a brazing material 1272 arranged on the inner surface of the sacrifice anode material 1273.

A metallic material, which is aluminum (Al) to which zinc (Zn) has been added, can be used as the sacrifice anode material 1273.

Other parts are the same as those in the fourteenth embodiment.

In the case of the present embodiment, by making the sacrifice anode material 1273 corrode before the core material 1271 also in the outer shell plate 1027, the core material 1271 can be prevented from corroding. Because of this, corrosion is unlikely to advance in the direction of thickness of the outer shell plate 1027 and the cooling tube 1002 can be prevented from being pitted.

Other features have the same functions and effects as those in the fourteenth embodiment.

[Sixteenth Embodiment]

Figure 36:
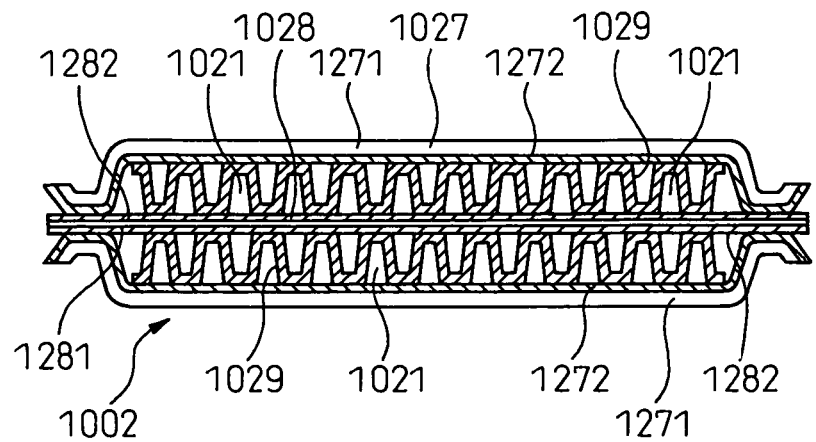
FIG. 36 is a sectional view of a cooling tube, which is perpendicular to a refrigerant flow passage in a sixteenth embodiment.
Figure 37:
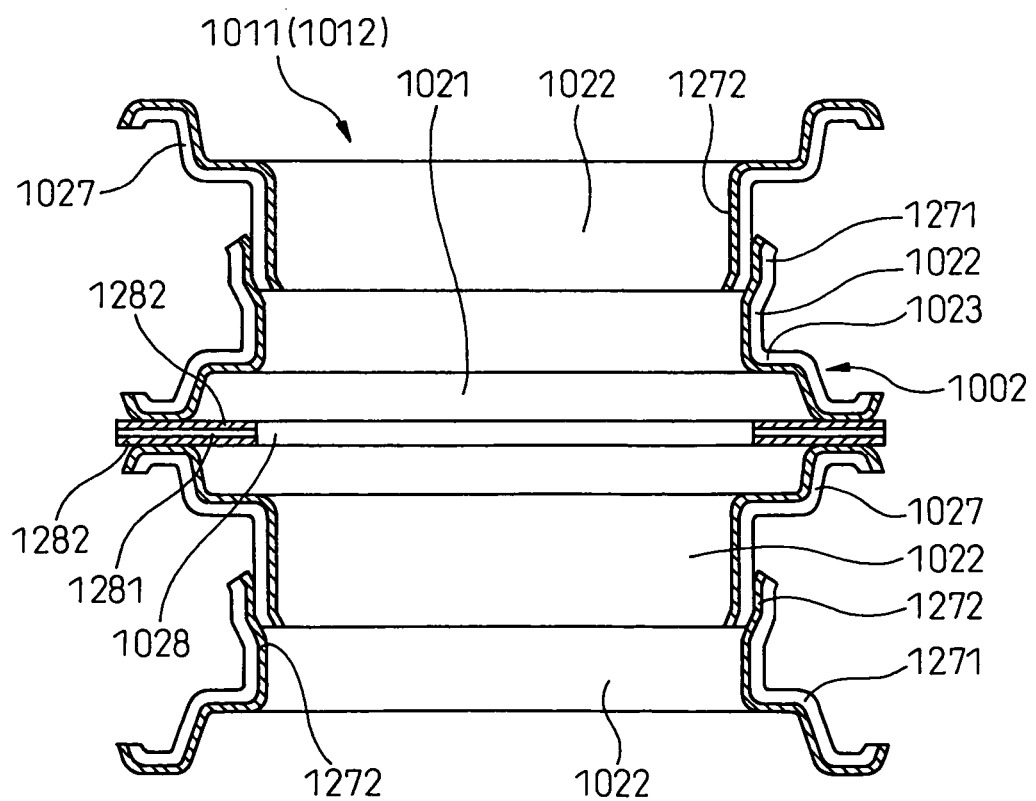
FIG. 37 is a sectional view of a supply header section (or a discharge header section) in the sixteenth embodiment.
Figure 38:
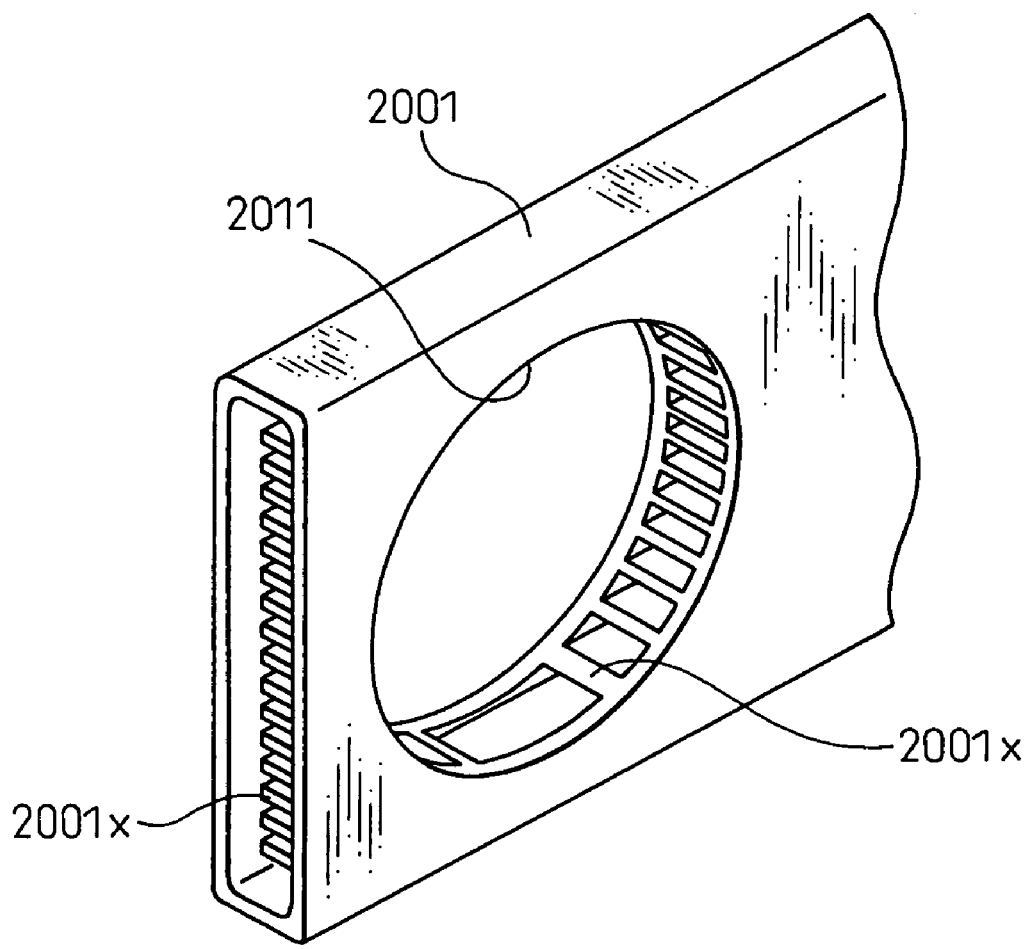
FIG. 38 is a perspective view of a tube alone in a conventional cooler.
Figure 39:
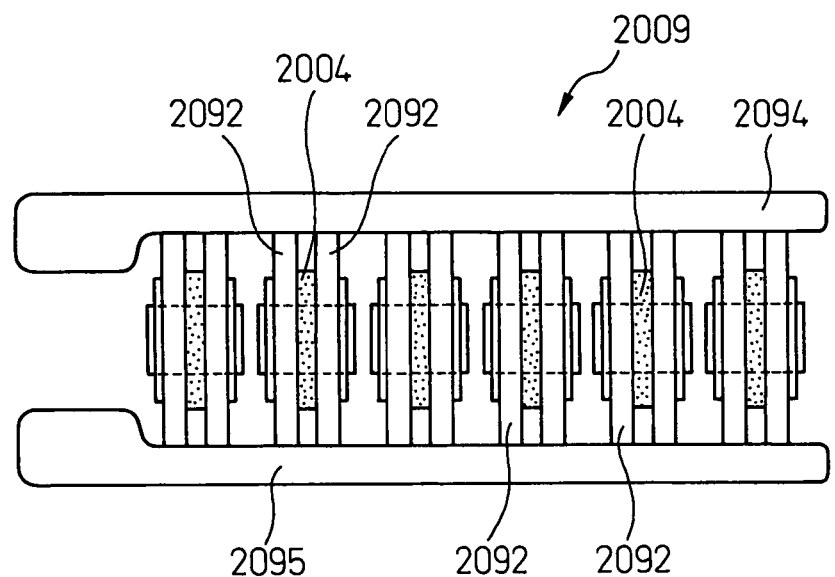
FIG. 39 is a plan view of a cooler of a built-up type in a conventional example.
Figure 40:
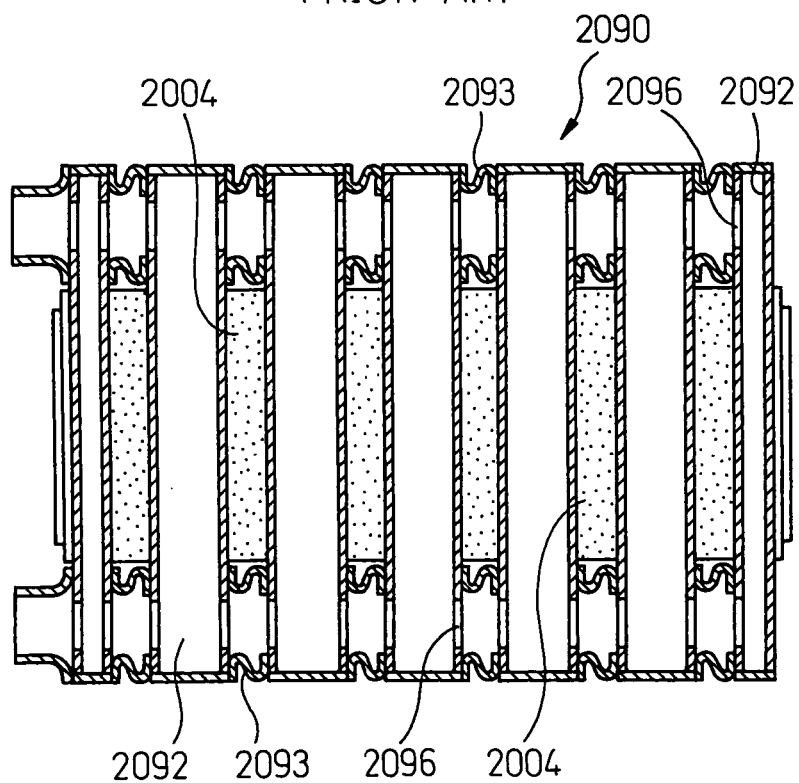
FIG. 40 is a sectional view of a cooler of a built-up type in another conventional example.

A sixteenth embodiment is an embodiment, as shown in FIG. 36 and FIG. 37, in which, as the outer shell plate 1027, a brazing sheet having a core material 1271 and a sacrifice anode material 1273 arranged on the inner surface of the core material 1271, is used.

An intermediate plate 1028 is made of a brazing sheet having a core material 1281 and a brazing material 1282 arranged on both sides of the core material 1281. An inner fin 1029 is composed of a metallic plate including a metal baser (a metal having a lower corrosion potential) than the core material 1271 of the outer shell plate 1027.

A metallic material, which is aluminum (Al) to which zinc (Zn) has been added, can be used as a metallic plate making up the inner fin 1029, and a sacrifice anode material 1273.

A pair of the outer shell plates 1027 is formed by joining the inner surfaces at the ends thereof to both sides at the ends of the intermediate plate 1028.

Moreover, as shown in FIG. 37, the protruding pipe part 1022 is composed of the outer shell plate 1027 on which the brazing material is not arranged. Therefore, the protruding pipe parts 1022 of neighboring cooling tubes 1002 are joined by newly arranging a paste brazing material, a ring brazing material, etc (not shown).

Other features are the same as those in the eleventh embodiment.

In the case of the present embodiment, it becomes possible to cover the entire inner surface of the cooling tube 1002 with the sacrifice anode material 1273, to prevent the core material 1271 of the outer shell plate 1027 from corroding and to prevent the cooling tube 1002 from being pitted.

Moreover, a pair of the outer shell plates 1027 are joined to the end parts of both sides of the intermediate plate 1028, on both sides of which the brazing material 1282 has been arranged. Therefore, it is possible to easily join a pair of the outer shell plates 1027 to the intermediate plate 1028 by brazing and to easily manufacture the cooling tube 1002.

Other features have the same functions and effects as those in the eleventh embodiment.

[Other Embodiments]

In the embodiments described above, aluminum is used as a material of a tube and a fin, but a metallic material such as copper and resin can also be used as a material of a tube and a fin, and in this case, a material having a high thermal conductivity is preferable.

In each of the embodiments described above, water mixed with an ethylene glycol base antifreeze liquid is used as a cooling fluid, but a natural refrigerant such as water and ammonia, a fluorocarbon base refrigerant such as fluorinate, a chlorofluorocarbon base refrigerant such as HCFC123 and HFC134a, an alcohol-based refrigerant such as methanol and alcohol, and a ketone-based refrigerant such as acetone can also be used as a cooling fluid.

In the embodiments described above, the present invention is applied to cooling of a semiconductor module of a double-sided cooling type of an inverter for a hybrid electric vehicle, but the present invention can also be applied to cooling of, for example, a semiconductor module of a motor drive inverter for industrial equipment, an air-conditioning inverter for air-conditioning buildings, etc.

The cooler according to the present invention can also cool an electronic part such as a power transistor, a power FET, and an IGBT, in addition to the semiconductor module 6.

While the invention has been described by reference to specific embodiments chosen for the purposes of illustration, it should be apparent that numerous modifications could be made thereto by those skilled in the art without departing from the basic concept and scope of the invention.

What is claimed is:

1. A cooler of a built-up type for cooling electronic parts from both sides thereof, comprising:
    a plurality of flat cooling tubes provided with a refrigerant flow passage through which a cooling medium flows and arranged in layers, so as to sandwich and hold the electronic parts at both sides thereof; and
    a supply header section for supplying the cooling medium to each of the refrigerant flow passages; and
    a discharge header section for discharging the cooling medium from each of the refrigerant flow passages; wherein
    each of the cooling tubes has protruding pipe parts opening and protruding toward the direction of built-up of the cooling tubes,
    neighboring cooling tubes make the refrigerant flow passages thereof communicate with each other by inserting the protruding pipe parts into each other and, at the same time, joining the sidewalls of the protruding pipe parts to each other, and thus forming the supply header section and the discharge header section,
    the electronic part contacts a plate-shaped surface of the cooler,
    the protruding pipe parts are formed so as to protrude in a vertical direction from the plate-shaped surface of the cooler, and
    a diaphragm part which deforms in a direction of built-up is formed on a periphery of a root part of at least one of the protruding pipe parts of each tube.

2. A cooler of a built-up type as set forth in claim 1, wherein each of the cooling tubes has the diaphragm part formed only around the one of a pair of the protruding pipe parts arranged in opposition to each other, but not one formed around the other of a pair of the protruding pipe parts.

3. A cooler of a built-up type as set forth in claim 2, wherein each of the cooling tubes has the diaphragm part formed around the one of a pair of the protruding pipe parts, which is formed on the downstream side of the supply header section.

4. A cooler of a built-up type as set forth in claim 1, wherein each of the cooling tubes has a throttle part at an inlet part of the refrigerant flow passage, which narrows a width of the refrigerant flow passage.

5. A cooler of a built-up type as set forth in claim 1, wherein each of the cooling tubes has a pair of outer shell plates, an intermediate plate arranged between the pair of the outer shell plates, and corrugated inner fins arranged between the intermediate plate and the outer shell plates.

6. A cooler of a built-up type as set forth in claim 5, wherein the outer shell plates are made of a brazing sheet having a core material and a brazing material arranged on an inner surface of the core material, the intermediate plate and the inner fins are made of metal plate including a metal baser than the core material of the outer shell plates, and a pair of the outer shell plates are formed by joining the inner surfaces at the ends thereof to each other.

7. A cooler of a built-up type as set forth in claim 6, wherein each of the outer shell plates is made of a brazing sheet having a core material, a sacrifice anode material arranged on the inner surface of the core material, and the brazing material arranged on an inner surface of the sacrifice anode material.

8. A cooler of a built-up type as set forth in claim 5, wherein each of the outer shell plate is made of a brazing sheet having a core material and a sacrifice anode material arranged on an inner surface of the core material, the intermediate plate is made of a brazing sheet having a core material and brazing materials arranged on both sides of the core material, the inner fins are made of a metal plate including a metal baser than the core material of the outer shell plate, and a pair of the outer shell plates are formed by joining the inner surfaces at ends thereof to both sides of the intermediate plate at ends thereof.

9. A cooler of a built-up type as set forth in claim 1, wherein a first cooling tube arranged at one end in the direction of built-up of a plurality of the cooling tubes has a refrigerant introduction inlet for introducing the cooling medium to the supply header section and a refrigerant discharge outlet for discharging the cooling medium from the discharge header section, each of the refrigerant introduction inlet and the refrigerant discharge outlet has a protruding opening part protruding toward the outside of the first cooling tube, and a refrigerant introduction pipe and a refrigerant discharge pipe are inserted into the protruding opening parts at the refrigerant introduction inlet and the refrigerant discharge outlet, respectively.

* * * * *